US010241267B2

(12) United States Patent
Kiyota et al.

(10) Patent No.: US 10,241,267 B2
(45) Date of Patent: Mar. 26, 2019

(54) SEMICONDUCTOR OPTICAL INTEGRATED DEVICE INCLUDING A REDUCED THICKNESS UPPER CLADDING LAYER IN A RIDGE WAVEGUIDE PORTION, AND METHOD OF MANUFACTURING THE SAME

(71) Applicant: FURUKAWA ELECTRIC CO., LTD., Tokyo (JP)

(72) Inventors: Kazuaki Kiyota, Tokyo (JP); Tatsuya Kimoto, Tokyo (JP); Yusuke Saito, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 13 days.

(21) Appl. No.: 15/423,082

(22) Filed: Feb. 2, 2017

(65) Prior Publication Data
US 2017/0146734 A1     May 25, 2017

Related U.S. Application Data

(63) Continuation of application No. PCT/JP2015/078161, filed on Oct. 5, 2015.

(30) Foreign Application Priority Data

Oct. 6, 2014 (JP) ................................. 2014-205739

(51) Int. Cl.
*G02B 6/12* (2006.01)
*G02B 6/122* (2006.01)
(Continued)

(52) U.S. Cl.
CPC ............... *G02B 6/122* (2013.01); *G02B 6/12* (2013.01); *G02B 6/12011* (2013.01);
(Continued)

(58) Field of Classification Search
None
See application file for complete search history.

(56) References Cited

U.S. PATENT DOCUMENTS

| 8,401,352 B2 * | 3/2013 | Hayakawa | ....... B29D 11/00663 |
| | | | 385/14 |
| 2009/0232445 A1 | 9/2009 | Jeong | |

FOREIGN PATENT DOCUMENTS

| JP | 2002-232069 | 8/2002 |
| JP | 2007-134480 | 5/2007 |

(Continued)

OTHER PUBLICATIONS

International Search Report dated Nov. 17, 2015 in PCT/JP2015/078161, filed on Oct. 5, 2015 (with English Translation).

(Continued)

*Primary Examiner* — Akm Enayet Ullah
(74) *Attorney, Agent, or Firm* — Oblon, McClelland, Maier & Neustadt, L.L.P.

(57) ABSTRACT

A semiconductor optical integrated device includes: a substrate; at least a lower cladding layer, a waveguide core layer, and an upper cladding layer sequentially layered on the substrate, a buried hetero structure waveguide portions each having a waveguide structure in which a semiconductor cladding material is embedded near each of both sides of the waveguide core layer; and a ridge waveguide portion having a waveguide structure in which a semiconductor layer including at least the upper cladding layer protrudes in a mesa shape. Further, a thickness of the upper cladding layer in each of the buried hetero structure waveguide portions is greater than a thickness of the upper cladding layer in the ridge waveguide portion.

12 Claims, 16 Drawing Sheets

(51) Int. Cl.
| | |
|---|---|
| *G02B 6/132* | (2006.01) |
| *G02B 6/136* | (2006.01) |
| *G02F 1/225* | (2006.01) |
| *H01S 5/026* | (2006.01) |
| *H01S 5/40* | (2006.01) |
| *G02F 1/025* | (2006.01) |
| *G02F 1/017* | (2006.01) |
| *G02F 1/21* | (2006.01) |
| *H01S 5/12* | (2006.01) |
| *H01S 5/223* | (2006.01) |
| *H01S 5/343* | (2006.01) |
| *H01S 5/50* | (2006.01) |
| *H01S 5/20* | (2006.01) |

(52) U.S. Cl.
CPC ......... *G02B 6/12019* (2013.01); *G02B 6/132* (2013.01); *G02B 6/136* (2013.01); *G02F 1/025* (2013.01); *G02F 1/2257* (2013.01); *H01S 5/0268* (2013.01); *H01S 5/4012* (2013.01); *H01S 5/4025* (2013.01); *G02B 2006/12097* (2013.01); *G02B 2006/12121* (2013.01); *G02B 2006/12142* (2013.01); *G02F 1/017* (2013.01); *G02F 2001/212* (2013.01); *G02F 2201/063* (2013.01); *G02F 2202/102* (2013.01); *H01S 5/12* (2013.01); *H01S 5/209* (2013.01); *H01S 5/2232* (2013.01); *H01S 5/3434* (2013.01); *H01S 5/4087* (2013.01); *H01S 5/50* (2013.01)

(56) References Cited

FOREIGN PATENT DOCUMENTS

| | | |
|---|---|---|
| JP | 2009-222790 | 10/2009 |
| JP | 2010-224280 | 10/2010 |
| JP | 2010-226062 | 10/2010 |
| JP | 2011-108829 | 6/2011 |
| JP | 2012-4441 | 1/2012 |
| JP | 2012-79990 | 4/2012 |
| JP | 2013-25242 | 2/2013 |

OTHER PUBLICATIONS

Written Opinion dated Nov. 17, 2015 in PCT/JP2015/078161, filed on Oct. 5, 2015.

* cited by examiner

SEMICONDUCTOR OPTICAL INTEGRATED DEVICE INCLUDING A REDUCED THICKNESS UPPER CLADDING LAYER IN A RIDGE WAVEGUIDE PORTION, AND METHOD OF MANUFACTURING THE SAME

CROSS-REFERENCE TO RELATED APPLICATION(S)

This application is a continuation of International Application No. PCT/JP2015/078161, filed on Oct. 5, 2015 which claims the benefit of priority of the prior Japanese Patent Application No. 2014-205739, filed on Oct. 6, 2014, the entire contents of which are incorporated herein by reference.

BACKGROUND

The present disclosure relates to a semiconductor optical integrated device and a method of manufacturing the same.

Recently, a higher performance is required for a semiconductor optical integrated device from a viewpoint of advancement of optical communication and cost reduction. Further, in order to integrate a plurality of optical devices in a single semiconductor device, different waveguide structures suitable for each function of devices are used in the same semiconductor device (see, for example, Japanese Laid-open Patent Publication No. 2013-25242). For example, the different waveguide structures are used in the same semiconductor device in such a manner that an buried hetero structure waveguide structure having high current injection efficiency is used in a region serving a light emitting function of a semiconductor optical integrated device and a deep ridge waveguide having a low bending loss is used in a region serving a function of bending a waveguide.

Known examples of the case where it is necessary to form a plurality of waveguide structures on the same semiconductor optical integrated device include the following cases: a case where a laser oscillating portion is formed using a buried hetero structure waveguide and an arrayed waveguide diffraction grating (AWG) is formed using a deep ridge waveguide (see, for example, Japanese Laid-open Patent Publication No. 2002-232069); a case where a laser oscillator is formed using a buried hetero structure waveguide and a ring resonator is formed using a deep ridge waveguide (see, for example, Japanese Laid-open Patent Publication No. 2011-108829); and a case where a laser oscillating portion is formed using a buried hetero structure waveguide and a modulator is formed using a deep ridge waveguide (see, for example, Japanese Laid-open Patent Publication No. 2012-079990 and Japanese Laid-open Patent Publication No. 2010-226062).

The buried hetero structure waveguide and the deep ridge waveguide have different characteristics, and thus, it is possible to realize a multi-function and high-performance optical integrated device if the different waveguides are suitably used for each device integrated in the single semiconductor optical integrated device. However, when the buried hetero structure waveguide and the deep ridge waveguide are integrated using the conventional method, there is a problem that it is difficult to sufficiently exhibit the performance as the semiconductor optical integrated device since each optimal design is different between the buried hetero structure waveguide and the deep ridge waveguide.

That is, when the optimal design for the buried hetero structure waveguide is conducted in the same semiconductor optical integrated device, it is not the optimal design for the deep ridge waveguide so that the performance of the deep ridge waveguide is suppressed. Conversely, when the optimal design for the deep ridge waveguide is conducted, it is not the optimal design for the buried hetero structure waveguide so that the performance of the buried hetero structure waveguide is suppressed. In this manner, when the buried hetero structure waveguide and the deep ridge waveguide are configured in the same semiconductor optical integrated device, there is a trade-off relationship of performance between the buried hetero structure waveguide and the deep ridge waveguide.

SUMMARY

It is an object of the present disclosure to at least partially solve the problems in the conventional technology.

According to an embodiment of the present disclosure, a semiconductor optical integrated device includes: a substrate; at least a lower cladding layer, a waveguide core layer, and an upper cladding layer sequentially layered on the substrate, buried hetero structure waveguide portions each having a waveguide structure in which a semiconductor cladding material is embedded near each of both sides of the waveguide core layer; and a ridge waveguide portion having a waveguide structure in which a semiconductor layer including at least the upper cladding layer protrudes in a mesa shape. Further, a thickness of the upper cladding layer in each of the buried hetero structure waveguide portions is greater than a thickness of the upper cladding layer in the ridge waveguide portion.

The above and other objects, features, advantages and technical and industrial significance of this disclosure will be better understood by reading the following detailed description of presently preferred embodiments of the disclosure, when considered in connection with the accompanying drawings.

DETAILED DESCRIPTION

Figure 1:
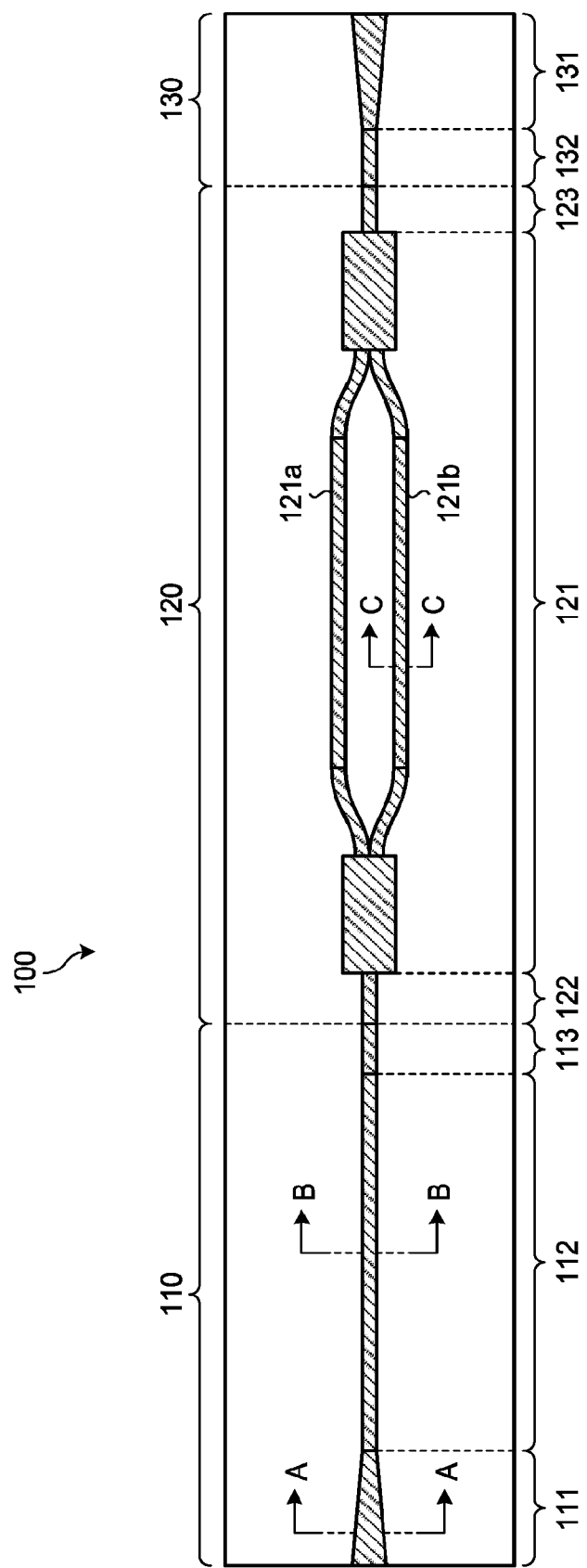
FIG. 1 is a schematic top view illustrating a semiconductor optical integrated device according to a first embodiment.

Hereinafter, embodiments of a semiconductor optical integrated device and a method of manufacturing the same according to the disclosure will be described with reference to the drawings. Incidentally, it should be noted that the present disclosure is not limited by the embodiments to be described hereinafter. In addition, the same or corresponding components will be denoted appropriately by the same reference signs in the respective drawings. Further, it should be noted that the drawings are schematic and relationship or ratios among dimensions of the respective components may differ from those of the actual. Portions having different relationships or ratios among their dimensions among the drawings may also be included.

A buried hetero structure waveguide is, for example, suitable for a device that operates under current injection such as a laser oscillator and an optical amplifier. A buried hetero structure waveguide structure has advantages such as low surface recombination speed, low electric resistance, low thermal impedance, and a small light scattering loss, and thus, is suitable for the device that operates under current injection.

In addition, the buried hetero structure waveguide performs optical confinement in the vertical direction and the optical confinement in the horizontal direction in the same structure, and thus, it is easy to form a window structure adjacently to the buried hetero structure waveguide. Meanwhile, when the window structure portion is formed adjacently to a deep ridge waveguide, it is necessary to implement removal of a core layer in the window structure portion and formation of a deep ridge while preventing etching of the right and left thereof in different steps, and a positional deviation or the like is likely to occur. Such a window structure is generally used for low reflection at an end face of the laser oscillator or the optical amplifier, and thus, from such a viewpoint, the buried hetero structure waveguide is more suitable for the laser oscillator or the optical amplifier than the deep ridge waveguide.

Another example of a semiconductor optical device for which the buried hetero structure waveguide is suitable is a Spot Size Converter (SSC). The SSC includes a tapered-type in which a width of a core layer is gradually decreased in order to expand a spot size, and a flare type in which the width of the core layer is conversely increased in a gradual manner. In particular, characteristics of spot size conversion in the horizontal direction greatly differ between a buried hetero structure waveguide and a deep ridge waveguide.

The tapered-type SSC uses evanescent component of light caused by a decrease of a mode refractive index of a waveguide, but it is extremely difficult to decrease the mode refractive index to the same level as a refractive index of a cladding layer in a waveguide structure in which a difference between refractive indices of the core layer and the cladding layer is significantly great like a deep ridge waveguide, and it is practically impossible to manufacture the tapered spot size converter using a deep ridge waveguide.

In addition, the flare-type SSC is capable of using a deep ridge waveguide structure, but the deep ridge waveguide has demerits that a beam shape deviates from a Gaussian shape or that the multi-mode influence remarkably appears in a flare portion. As a result, a buried hetero structure waveguide is more suitable than a deep ridge waveguide both in the tapered-type SSC and the flare-type SSC.

Meanwhile, an example of a semiconductor optical device for which the deep ridge waveguide is suitable is a bending waveguide. A deep ridge waveguide has a characteristic that a bending loss is small as a refractive index difference between the core and the cladding is great in relation to the right-and-left direction. Therefore, a deep ridge waveguide can set a smaller radius of curvature than the buried hetero structure waveguide when assuming the same allowable bending loss. That is, a semiconductor optical device using the deep ridge waveguide has a characteristic that it is advantageous for miniaturization of the device as compared to the device using the buried hetero structure waveguide.

Another example of the semiconductor optical device using a deep ridge waveguide is an optical modulator. An optical modulator applies a high-frequency signal to a device for high-speed modulation, and thus, an electrical response characteristic with respect to high frequency is important. A semiconductor optical device using the deep ridge waveguide has favorable high-frequency response since there are few constituents that increase a parasitic capacitance near the waveguide. As a result, a semiconductor optical device using the deep ridge waveguide is suitable to be used as an optical modulator as compared to the device using a buried hetero structure waveguide.

As above, there are semiconductor optical devices for which the buried hetero structure waveguide is suitable and semiconductor optical devices for which the deep ridge waveguide is suitable. A first embodiment to be described hereinafter is a semiconductor optical integrated device in which the SSC and a Semiconductor Optical Amplifier (SOA) are configured using the buried hetero structure waveguide structure and the modulator is configured using the deep ridge waveguide structure. In addition, a second embodiment to be described later is a semiconductor optical integrated device in which Distributed FeedBack (DFB) lasers and an SOA are configured using a buried hetero structure waveguide structure and an AWG is configured using the deep ridge waveguide structure.

First Embodiment
Planar Structure

FIG. 1 is a schematic top view illustrating the semiconductor optical integrated device according to the first embodiment. Incidentally, the schematic top view illustrated in FIG. 1 illustrates only a waveguide and does not illustrate other components such as an electrode for simplification.

As illustrated in FIG. 1, a semiconductor optical integrated device 100 according to the first embodiment is provided with a buried hetero structure waveguide portion 110, a ridge waveguide portion 120, and a buried hetero structure waveguide portion 130. The buried hetero structure waveguide portions 110 and 130 are regions each of which has a waveguide in which semiconductor cladding materials are embedded near both sides of a waveguide core layer, and the ridge waveguide portion 120 is a region which has a waveguide in which a semiconductor layer including at least a waveguide core layer and an upper cladding layer protrudes in a mesa shape. Incidentally, the waveguide of the mesa waveguide portion 120 according to this embodiment has a so-called deep ridge waveguide structure in which a part up to the semiconductor layer including at least the waveguide core layer protrudes in the mesa shape.

The buried hetero structure waveguide portion 110 is provided with a SSC 111 and an SOA 112. The SSC 111 reduces a spot size of guided light incident from an incident end face of the buried hetero structure waveguide portion 110, and the SOA 112 amplifies optical intensity of the guided light whose stop size has been reduced by the SSC 111. The guided light amplified by the SOA 112 is guided to the mesa waveguide portion 120.

The ridge waveguide portion 120 is provided with a Mach-Zehnder modulator 121. As illustrated in FIG. 1, the Mach-Zehnder modulator 121 is provided with two waveguides 121a and 121b as arm waveguides. The guided light input to the Mach-Zehnder modulator 121 is branched into the two waveguides 121a and 121b, and thereafter, combined into a single beam. When a voltage according to an electric signal is applied to the two waveguides 121a and 121b in the course thereof, a phase difference is generated in the branched light, and the signal is superimposed by interference at the time of recombination. The guided light modulated by the Mach-Zehnder modulator 121 is guided to the buried hetero structure waveguide portion 130.

The buried hetero structure waveguide portion 130 is provided with an SSC 131. The SSC 131 expands the spot size of the guided light incident from the mesa waveguide portion 120 and emits the resultant from the semiconductor optical integrated device 100. As the semiconductor optical integrated device 100 is provided with the SSC 131, it is easy to incorporate the semiconductor optical integrated device 100 inside a module.

In the semiconductor optical integrated device 100 configured as described above, it is possible to enjoy advantages that surface recombination speed is low at a portion near the waveguide and power efficiency to obtain a gain is high since the waveguide of the SOA 112 is a buried hetero structure type, and further, it is possible to enjoy advantages that parasitic capacitance is low and frequency response is high since the waveguide of the modulator 121 is a ridge type.

Incidentally, buried hetero structure waveguides 113 and 132 and ridge waveguides 122 and 123 are present at boundaries between each of the buried hetero structure waveguide portions 110 and 130 and the ridge waveguide portion 120 of the semiconductor optical integrated device 100 so as to connect the buried hetero structure waveguide portion and the ridge waveguide portion. The ridge waveguides 122 and 123 may be configured to have a wider width than the buried hetero structure waveguides 113 and 132 at connection points between each of the buried hetero structure waveguides 113 and 132 and each of the ridge waveguides 122 and 123. Alternatively, both the buried hetero structure waveguides 113 and 132 and the ridge waveguides 122 and 123 may have a flare structure such that the waveguide at the connection point becomes thick. Through the above-described structures, it is possible to reduce a connection loss at each boundary between the buried hetero structure waveguide portions 110 and 130 and the ridge waveguide portion 120 (see Japanese Laid-open Patent Publication No. 2010-224280).

Further, an SSC for spot size conversion in the thickness direction may be additionally provided between each of the buried hetero structure waveguide portions 110 and 130 and the ridge waveguide portion 120 in order to mitigate mismatch in thickness of the waveguide core layers between each of the buried hetero structure waveguide portions 110 and 130 and the ridge waveguide portion 120.

Cross-Sectional Structure

Figure 2:
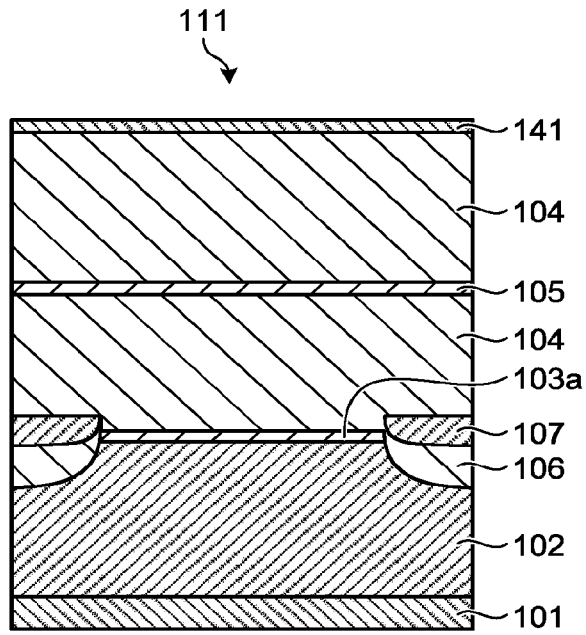
FIG. 2 is a cross-sectional schematic view of an SSC on a face perpendicular to a waveguide.
Figure 3:
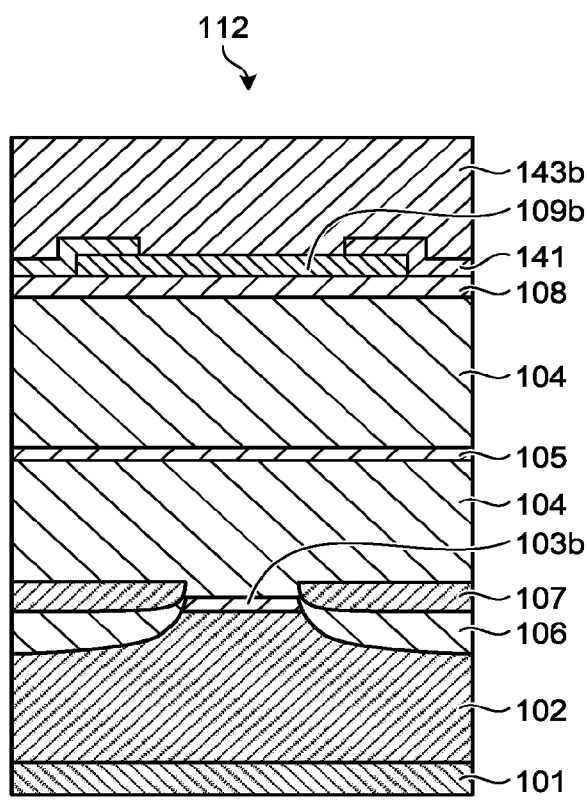
FIG. 3 is a cross-sectional schematic view of an SOA on the face perpendicular to the waveguide.
Figure 4:
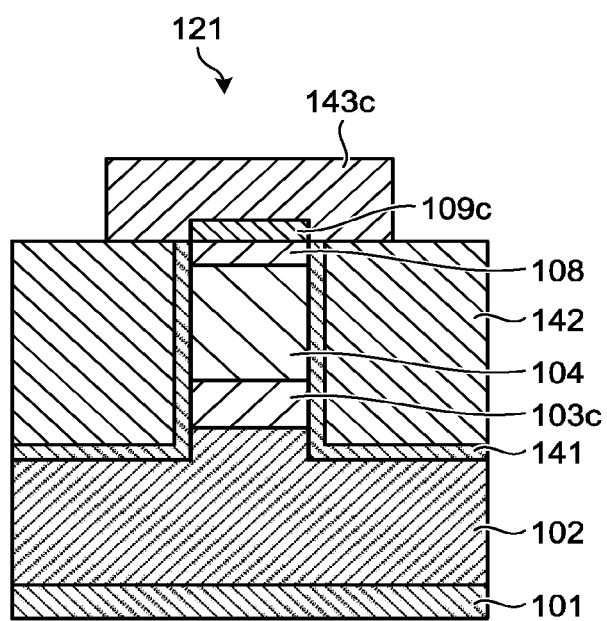
FIG. 4 is a cross-sectional schematic view of a modulator on the face perpendicular to the waveguide.

FIGS. 2 to 4 are cross-sectional schematic views of the SSC 111, the SOA 112, and the modulator 121 on a face perpendicular to the waveguide. The cross-sectional schematic view of the SSC 111 illustrated in FIG. 2 corresponds to a cross section A-A of FIG. 1, the cross-sectional view of the SOA 112 illustrated in FIG. 3 corresponds to a cross section B-B of FIG. 1, and the cross-sectional view of the modulator 121 illustrated in FIG. 4 corresponds to a cross section C-C of FIG. 1.

Cross-Sectional Structure: SSC

As illustrated in FIG. 2, the SSC 111 has a structure in which a lower cladding layer 102, a waveguide core layer 103a, and an upper cladding layer 104 are sequentially layered on a substrate 101. A material of the substrate 101 is InP, and a material of the lower cladding layer 102 is n-InP. Incidentally, the material of the substrate 101 may be n-InP. In addition, when a high-frequency characteristic is focused, an n-side electrode may be provided in the lower cladding layer 102 and the material of the substrate 101 may be semi-insulating InP.

The waveguide core layer 103a of the SSC 111 has a bulk structure whose material is GaInAsP. The composition of GaInAsP is adjusted so as to transmit light at a wavelength (for example, a band of 1.55 μm) of incident light. A width of the waveguide core layer 103a is 4 μm in an end face on a side having a large spot size, and 1.7 μm in an end face on a side having a small spot size, and the width smoothly transitions therebetween. A thickness of the waveguide core layer 103a of the SSC 111 is 75 nm in the end face on the side having the large spot size, and 150 nm in the end face on the side having the small spot size, and the thickness smoothly transitions therebetween.

A material of the upper cladding layer 104 is p-InP, and an intermediate layer 105, which has different etching resistance from the upper cladding layer 104 and slower etching speed than the upper cladding layer 104, is inserted horizontally therein. The intermediate layer 105 can stop etching of the upper cladding layer 104, and thus, will be referred to as an etching stop layer hereinafter. It is easy to control the thickness of the upper cladding layer 104 even in an integrated structure using this etching stop layer, and it is possible to obtain favorable characteristics. Incidentally, the method of using the etching stop layer 105 is more preferable, but it is also possible to omit the etching stop layer 105 depending on a manufacturing method. The thickness of the upper cladding layer 104 including the etching stop layer 105 is 4.5 μm. Incidentally, when the etching stop layer 105 is inserted, a thickness of the etching stop layer 105 is, for example, 10 nm.

The waveguide core layer 103a of the SSC 111 has a structure in which a lower embedded cladding layer 106 and an upper embedded cladding layer 107 are embedded near both sides of the waveguide core layer 103a. Materials of the lower embedded cladding layer 106 and the upper embedded cladding layer 107 are p-InP and n-InP, respectively.

In addition, a passivation film 141 is formed on a top face of the SSC 111.

Cross-Sectional Structure: SOA

As illustrated in FIG. 3, the SOA 112 has a structure in which the lower cladding layer 102, a waveguide core layer 103b, and the upper cladding layer 104 are sequentially layered on the substrate 101. Incidentally, the respective materials of the substrate 101, the lower cladding layer 102, and the upper cladding layer 104 are the same as those of the SSC 111.

The waveguide core layer 103b is configured to have a multi quantum well structure whose material is GaInAsP obtained by adjusting composition thereof so as to emit light by current injection at a wavelength (for example, a band of 1.55 μm) of incident light. In addition, the waveguide core layer 103b includes upper and lower SCH (separate confinement heterostructure) layers obtained by changing composition thereof in a stepwise manner and formed such that the multi quantum well structure is sandwiched therebetween in the thickness direction. A thickness of the waveguide core layer 103b including the SCH layer is 150 nm, and a width thereof is 1.7 μm.

The etching stop layer 105 having different etching resistance from the upper cladding layer 104 is inserted inside the upper cladding layer 104, which is similar to the SSC 111. Similarly, it is also possible to omit the etching stop layer 105 depending on a manufacturing method. A thickness of the upper cladding layer 104 including the etching stop layer 105 is 4.5 μm. Incidentally, when the etching stop layer 105 is inserted, a thickness of the etching stop layer 105 is, for example, 10 nm.

The waveguide core layer 103b of the SOA 112 has a structure in which the lower embedded cladding layer 106 and the upper embedded cladding layer 107 are embedded near both sides of the waveguide core layer 103b. Materials of the lower embedded cladding layer 106 and the upper embedded cladding layer 107 are p-InP and n-InP, respectively. The lower embedded cladding layer 106 and the upper embedded cladding layer 107 serve as current blocking layers, and enhance the injection efficiency of current to be injected into the waveguide core layer 103b.

A contact layer 108 made of p-GaInAs is provided on the upper cladding layer 104 and is in contact with a p-side electrode 109b. In addition, the passivation film 141 is suitably formed on the top face of the SSC 111. Further, the p-side electrode 109b is in contact with an on-chip wiring 143b obtained by gold plating.

Cross-Sectional Structure: Modulator

As illustrated in FIG. 4, the modulator 121 has a structure in which the lower cladding layer 102, a waveguide core layer 103c, and the upper cladding layer 104 are sequentially layered on the substrate 101. Incidentally, the respective materials of the substrate 101, the lower cladding layer 102, and the upper cladding layer 104 are the same as those of the SSC 111.

The waveguide core layer 103c is configured to have a multi quantum well structure whose material is AlGaInAs whose refractive index is changed when a voltage is applied and obtained by adjusting composition thereof. A thickness of the waveguide core layer 103c is 500 nm, which is greater than the waveguide core layers 103a and 103b of the buried hetero structure waveguide portions 110 and 130, and a width thereof is 1.5 μm.

A thickness of the upper cladding layer 104 is 1.5 μm which is less than the thickness of the upper cladding layer 104 of the buried hetero structure waveguide portion 110 or 130. The contact layer 108 made of p-GaInAs is provided on the upper cladding layer 104 and is in contact with a p-side electrode 109c. Further, the p-side electrode 109c is in contact with an on-chip wiring 143c obtained by gold plating.

The modulator 121 has the deep ridge waveguide structure in which the semiconductor layer including the upper cladding layer 104, the waveguide core layer 103c, and a part of the lower cladding layer 102 protrudes in a mesa shape. An etching depth of the lower cladding layer 102 is 300 nm.

An etching depth of the lower cladding layer 102 is designed to suppress a high-order mode. This deep ridge waveguide is designed such that the mode refractive index in the high-order mode is lower than the refractive index of a portion of the lower cladding layer 102 which is not subjected to etching. Thus, the high-order mode is leaked out to the substrate 101 side having the high refractive index, and thus, a loss difference from the fundamental mode is large, and practically, the operation is performed in a single mode. When the etching depth of the lower cladding layer 102 is large, a distance with respect to the substrate 101 having the high refractive index increases, and thus, the loss in the high-order mode decreases, and the practical single-mode property deteriorates. On the other hand, when the etching depth of the lower cladding layer 102 is too small, a loss in the bending waveguide increases in some cases.

Incidentally, the passivation film 141 whose material is SiNx is formed on both sides of the high-mesa structure portion of the modulator 121, and a low dielectric permittivity layer 142 whose material is polyimide is formed on each outer side thereof.

As described with reference to FIGS. 1 to 4 above, the thickness of the upper cladding layer 104 of the buried hetero structure waveguide portion 110 or 130 is set to be larger than the thickness of the upper cladding layer 104 of the ridge waveguide portion 120 in the semiconductor optical integrated device 100 according to this embodiment, and thus, it is possible to perform optimal designs for both the mesa waveguide portion and the buried hetero structure waveguide portion. As a result, the semiconductor optical integrated device 100 according to this embodiment can resolve a trade-off relationship of performance between the buried hetero structure waveguide and the deep ridge waveguide.

Further, the waveguide core layers 103a and 103b of the buried hetero structure waveguide portions 110 and 130 are thinner than the waveguide core layer of the ridge waveguide portion 120 in the semiconductor optical integrated device 100 according to the first embodiment. This is because the design focusing on the respective device characteristics has been performed as will be described hereinafter.

It is advantageous that the waveguide core layer 103b is thick to some extent and an optical confinement coefficient is large in the SOA 112 in order to earn an optical amplification gain, but an optical absorption loss increases due to a carrier of the waveguide core layer 103b at the time of current injection if the waveguide core layer 103b is excessively thick. In addition, when the number of quantum wells is increased to match for the increase of thickness, unevenness between the current-injected carriers and the quantum wells occurs, thereby increasing transparency current. In this manner, there is a limit in the increase of thickness of the waveguide core layer 103b of the SOA 112.

Meanwhile, the waveguide core layer 103c of the modulator 121 does not operate under current injection, and thus, there is no limit like the limit in the SOA 112, but it is necessary to increase a thickness of a non-doped layer in order to decrease a capacitance of the waveguide core layer 103c. It is necessary to form most of the non-doped layer to which a voltage is applied as the waveguide core layer 103c in order to increase a change amount in the refractive index per voltage, and thus, it is necessary to increase the thickness of the waveguide core layer 103c.

Thus, the waveguide core layer 103b of the buried hetero structure waveguide portion 110 is set to be thinner than the waveguide core layer 103c of the ridge waveguide portion 120, and both the suppression of the optical absorption loss and the reduction of the transparency current in the SOA 112 and the reduction of the capacitance in the modulator 121 are achieved in the semiconductor optical integrated device 100 according to the first embodiment.

Manufacturing Method

Next, a method of manufacturing the semiconductor optical integrated device 100 according to the first embodiment will be described with reference to FIGS. 5 to 12. In FIGS. 5 to 12, each aspect of manufacturing progress of the SSC 111, the SOA 112, and the modulator 121 in each step is described in parallel. A, B and C of FIGS. 5 to 12 illustrate each aspect of the manufacturing progress of the SSC 111 (A in the respective drawings), the SOA 112 (B in the respective drawings), and the modulator 121 (C in the respective drawings), and the drawings A, B and C of the same figure illustrates cross-sectional views of regions in which the SSC 111, the SOA 112, and the modulator 121 are formed in the same stage. Incidentally, the same reference signs are used to indicate the SSC 111, the SOA 112, and the modulator 121 even in the middle of manufacturing in order to make the description easy.

Figure 5:
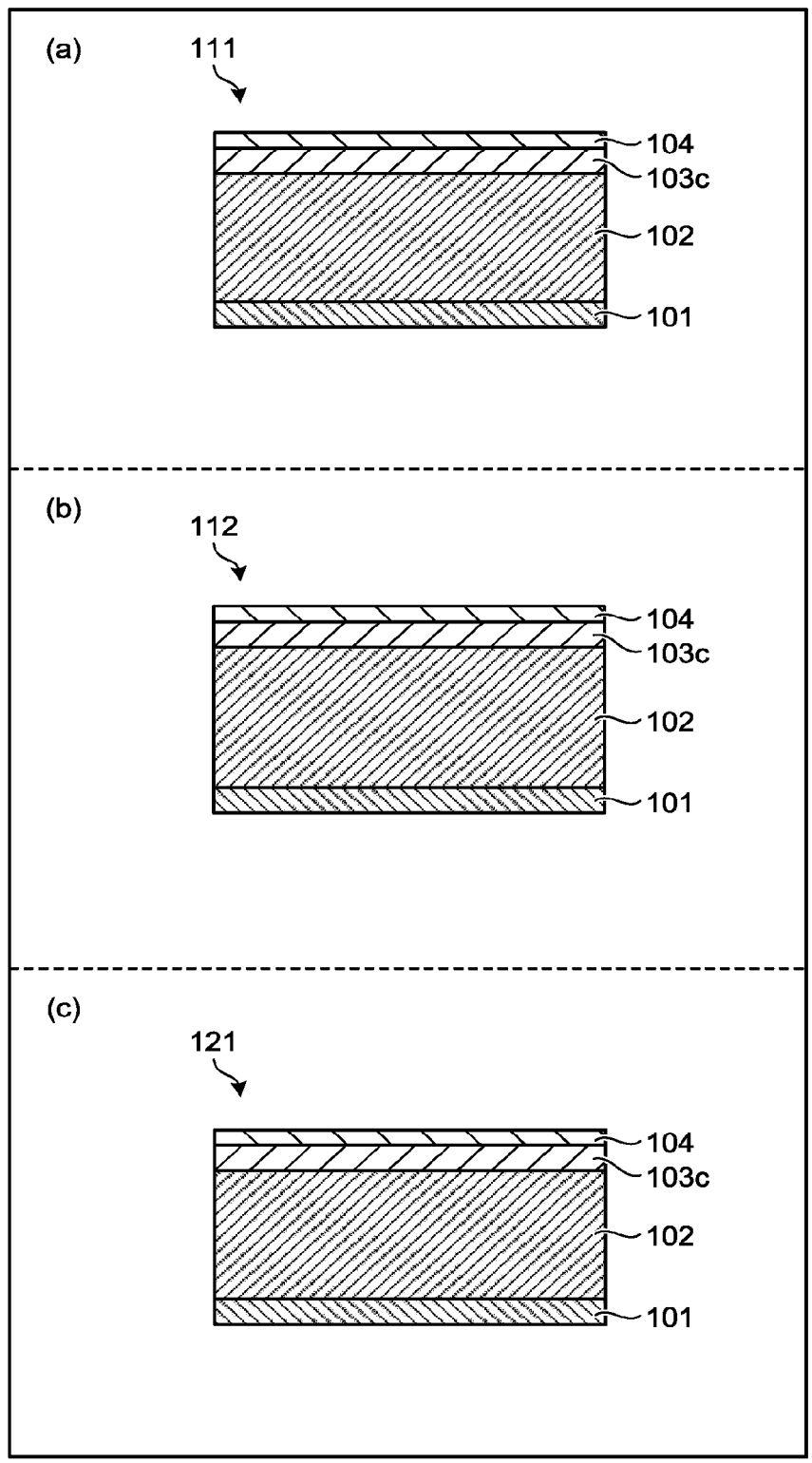
FIG. 5 is a diagram illustrating aspects of manufacturing progress of the semiconductor optical integrated device in a first step.
Figure 6:
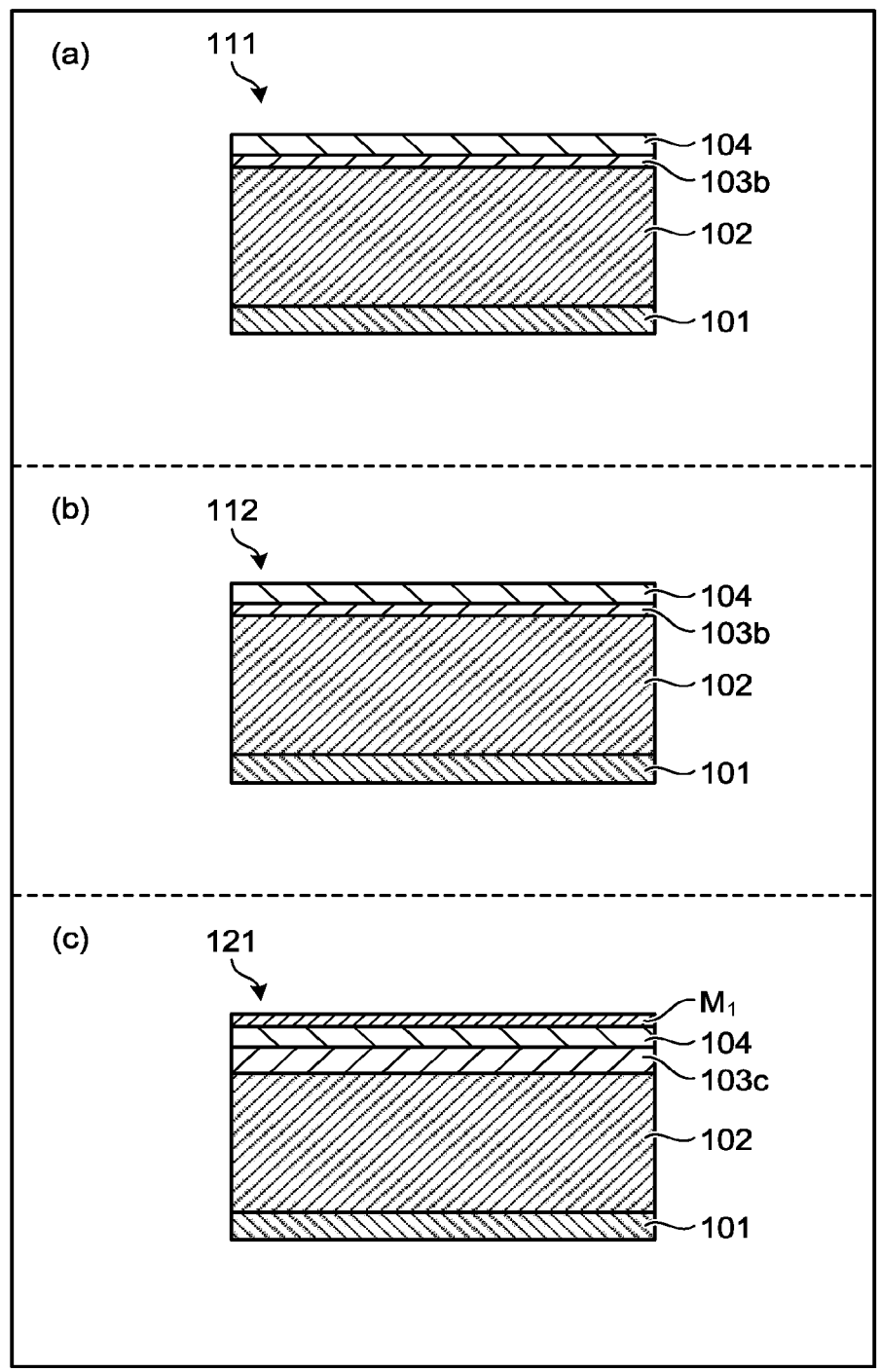
FIG. 6 is a diagram illustrating aspects of the manufacturing progress of the semiconductor optical integrated device in the first step.
Figure 7:
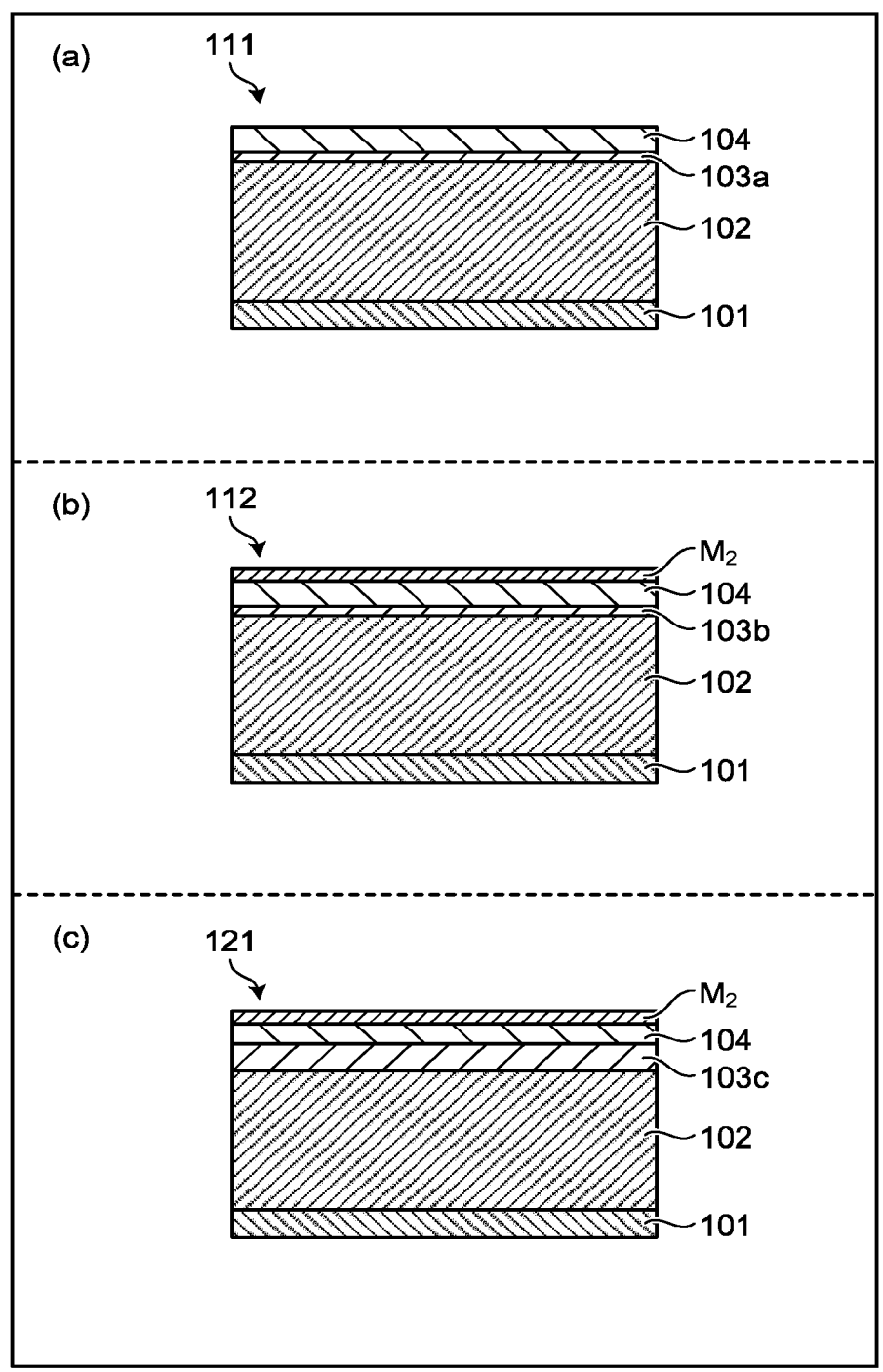
FIG. 7 is a diagram illustrating aspects of the manufacturing progress of the semiconductor optical integrated device in the first step.

FIGS. 5 to 7 are diagrams illustrating aspects of the manufacturing progress of the semiconductor optical integrated device 100 in a first step. In the first step, the lower cladding layer 102, the waveguide core layers 103a, 103b and 103c, and a part of the upper cladding layer 104 are sequentially layered on the substrate 101.

In the step illustrated in FIG. 5, first, the waveguide core layer 103c of the modulator 121 is formed in the entire region which is configured to form the SSC 111, the SOA 112, and the modulator 121. To be specific, n-InP as the lower cladding layer 102, AlGaInAs as the waveguide core layer 103c, and p-InP as the upper cladding layer 104 are sequentially layered on the substrate 101 made of InP using a metalorganic chemical vapor deposition (MOCVD) method. The waveguide core layer 103c manufactured in this step is the multi quantum well structure made of AlGaInAs. In addition, a thickness of the upper cladding layer 104 layered in this step is about 200 nm.

In the step illustrated in FIG. 6, the waveguide core layer 103c of the modulator 121, which has been formed in the region configured to form the SSC 111 and the SOA 112, is removed, and the waveguide core layer 103b of the SOA 112 is formed in the region configured to form the SSC 111 and the SOA 112. To be specific, a mask $M_1$ made of a SiNx film is deposited on the entire face, and then, a region which is slightly wider than a region of the modulator 121 is subjected to patterning, and etching is performed using this SiNx film as the mask $M_1$. In this etching, the removal up to the waveguide core layer 103c formed in the region configured to form the SSC 111 and the SOA 112 is performed, thereby exposing the lower cladding layer 102.

Subsequently, the mask $M_1$ of the SiNx film is directly used as the selective growth mask $M_1$, and the waveguide core layer 103b of the SOA 112 and a part of the upper cladding layer 104 are layered on the lower cladding layer 102 in the region configured to form the SSC 111 and the SOA 112 using a MOCVD method. The waveguide core layer 103b is formed of a lower GaInAsP-SCH layer whose composition is changed in a stepwise manner, an MQW active layer, and an upper GaInAsP-SCH layer whose composition is changed in a stepwise manner, and the upper cladding layer 104 is made of p-InP. In addition, a thickness of the upper cladding layer 104 layered in this step is about 500 nm, a top face of the upper cladding layer 104 is set to substantially match a top face of the upper cladding layer 104 in the region of the modulator 121.

In the step illustrated in FIG. 7, the waveguide core layer 103b of the SOA 112, which has been formed in the region configured to form the SSC 111, is removed, and the waveguide core layer 103a of the SSC 111 is formed in the region configured to form the SSC 111. To be specific, the mask $M_1$ of the SiNx film is once removed, and then, a new mask $M_2$ made of a SiNx film is deposited on the entire region, and then, a region which is slightly wider than the regions of the modulator 121 and the SOA 112 is subjected to patterning. At this time, a mask pattern is disposed near the region configured to form the SSC 111 such that a region having the larger thickness is closer to the device in order to obtain a selective growth effect to make the thickness of the waveguide core layer 103a of the SSC 111 gradually change. Further, etching is performed using this SiNx film as the mask $M_2$, and the removal up to the waveguide core layer 103b of the SOA 112 is performed, thereby exposing the lower cladding layer 102.

Subsequently, the mask $M_2$ of the SiNx film is directly used as the selective growth mask $M_2$, and the waveguide core layer 103a of the SSC 111 and a part of the upper cladding layer 104 are layered on the exposed lower cladding layer 102 in the region configured to form the SSC 111 using a MOCVD method. The waveguide core layer 103a is made of GaInAsP, and the upper cladding layer 104 is made of p-InP. In addition, a thickness of the upper cladding layer 104 layered in this step is about 500 nm, a top face of the upper cladding layer 104 is set to substantially match a top face of the upper cladding layer 104 in the regions of the modulator 121 and the SOA 112.

Figure 8:
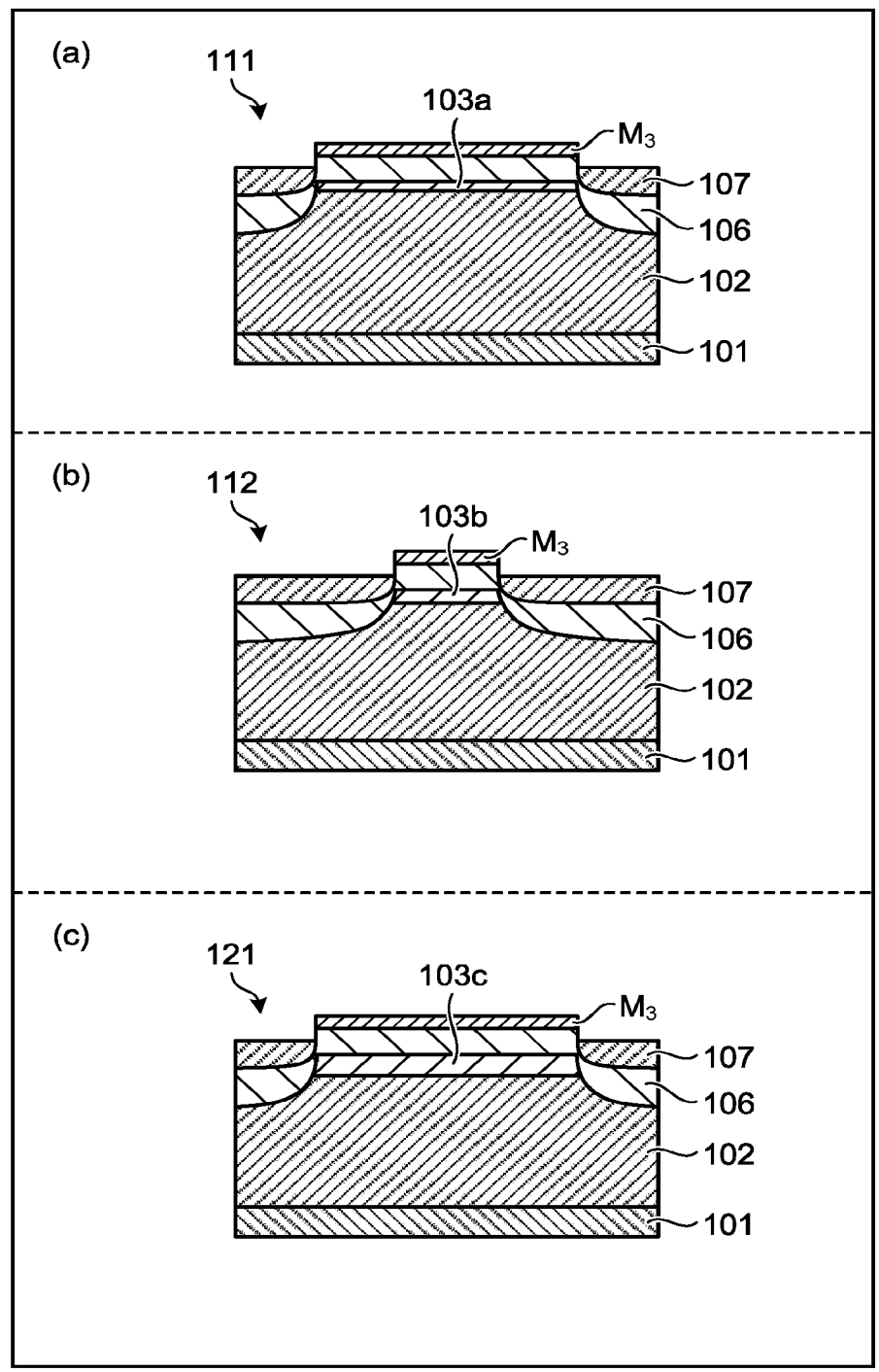
FIG. 8 is a diagram illustrating aspects of the manufacturing progress of the semiconductor optical integrated device in a second step and a third step.

FIG. 8 is a diagram illustrating aspects of the manufacturing progress of the semiconductor optical integrated device 100 in a second step and a third step. A layer including the waveguide core layer of the buried hetero structure waveguide is etched in a mesa shape in the second step, and a semiconductor cladding material is embedded near both sides of the waveguide core layer of the buried hetero structure waveguide portion in the third step.

The mask $M_2$ of the SiNx film is once removed, a mask $M_3$ made of a SiNx film is newly deposited on the entire face, and patterning, which corresponds to shapes of the modulator 121, the SOA 112, the SSC 111, and each waveguide of connection portions, is performed. At this time, the modulator 121, configured to form the deep ridge waveguide in the subsequent step, and the ridge waveguides 122 and 123 at the connection portions in the vicinity thereof are subjected to patterning in a shape having a wider width than the width of the waveguide.

Further, etching is performed using this SiNx film as the mask $M_3$, a mesa structure, which corresponds to the modulator 121, the SOA 112, the SSC 111, and the waveguides of the respective connection portions, is formed, and a region to bury an embedded layer in the lower cladding layer 102 is formed.

Next, the mask $M_3$ of the SiNx film is used as the selective growth mask $M_3$ at this time, and p-InP as the lower embedded cladding layer 106 and n-InP as the upper embedded cladding layer 107 are layered on the lower cladding layer 102 using a MOCVD method.

Figure 9:
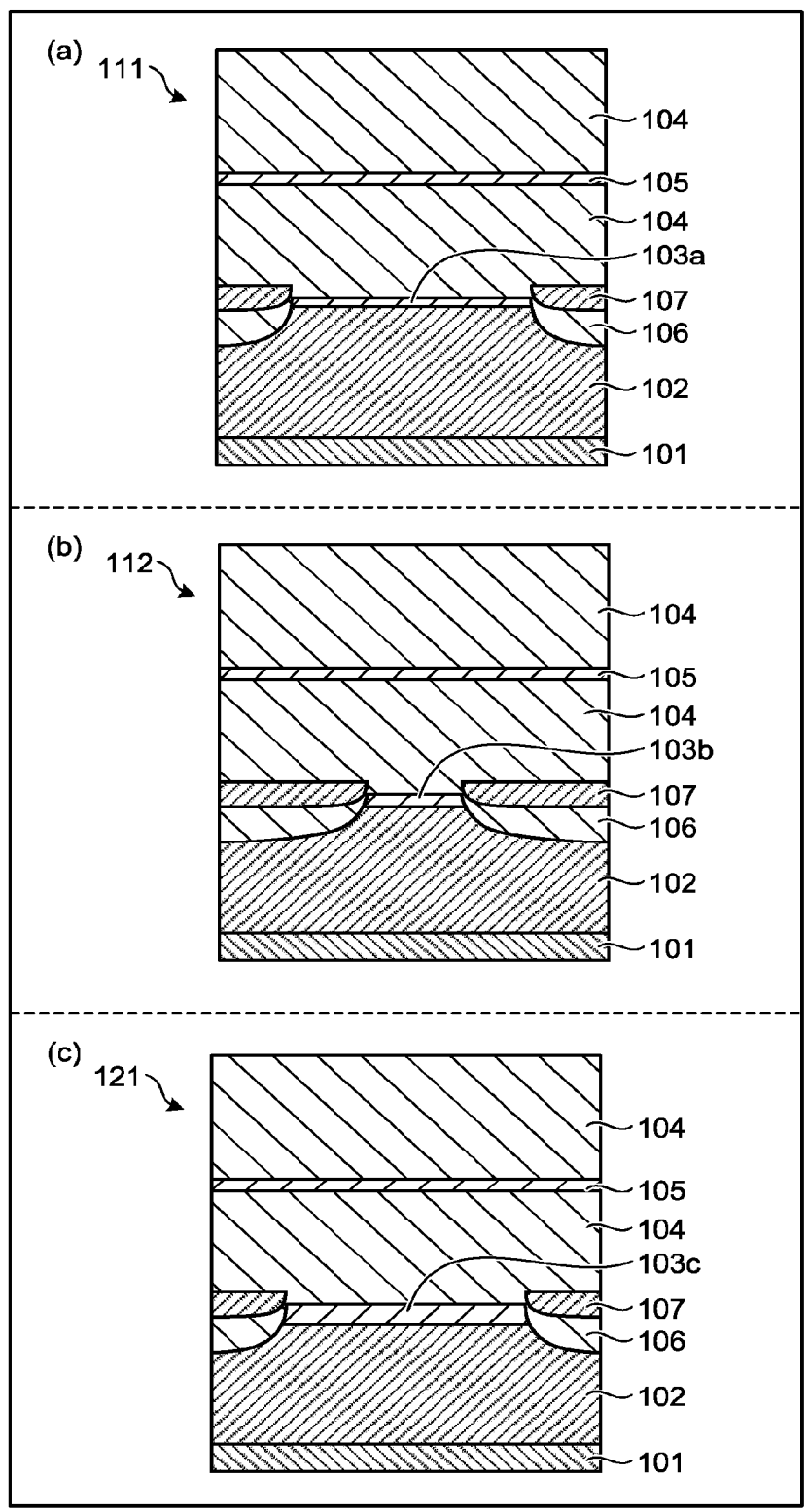
FIG. 9 is a diagram illustrating aspects of manufacturing progress of the semiconductor optical integrated device in a fourth step.

FIG. 9 is a diagram illustrating aspects of manufacturing progress of the semiconductor optical integrated device 100 in a fourth step. In the fourth step, a semiconductor layer including the upper cladding layer 104 is layered in the region configured to form the modulator 121, the SOA 112, and the SSC 111.

To be specific, the mask $M_3$ of the SiNx film is removed, and then, p-InP having a thickness of 1.3 µm is layered as the upper cladding layer 104, p-GaInAsP having a thickness of 10 nm is layered as the etching stop layer 105, and p-InP having a thickness of 2.2 µm is layered as the upper cladding layer 104 in the region, configured to form the modulator 121, the SOA 112, and the SSC 111, using the MOCVD method. Incidentally, the etching stop layer 105 is a layer having the different etching resistance from the upper cladding layer 104, and the etching of the layer is harder than etching of the upper cladding layer 104. The etching stop layer is configured to facilitate the manufacture and is not a layer which is necessary for operation of the device, and thus, is designed to be as thin as possible in a range of sufficiently allowing the etching stop. Similarly, it is preferable to set the composition thereof to be close to the upper cladding layer as much as possible in the range of allowing the etching stop. When the upper cladding is made of InP and the etching stop layer is made of GaInAsP, physical (a refractive index or a band gap) and chemical (etching speed) properties of GaInAsP differ from InP as a composition wavelength of GaInAsP becomes longer. A preferable composition wavelength is, for example, 1.1 µm.

Figure 10:
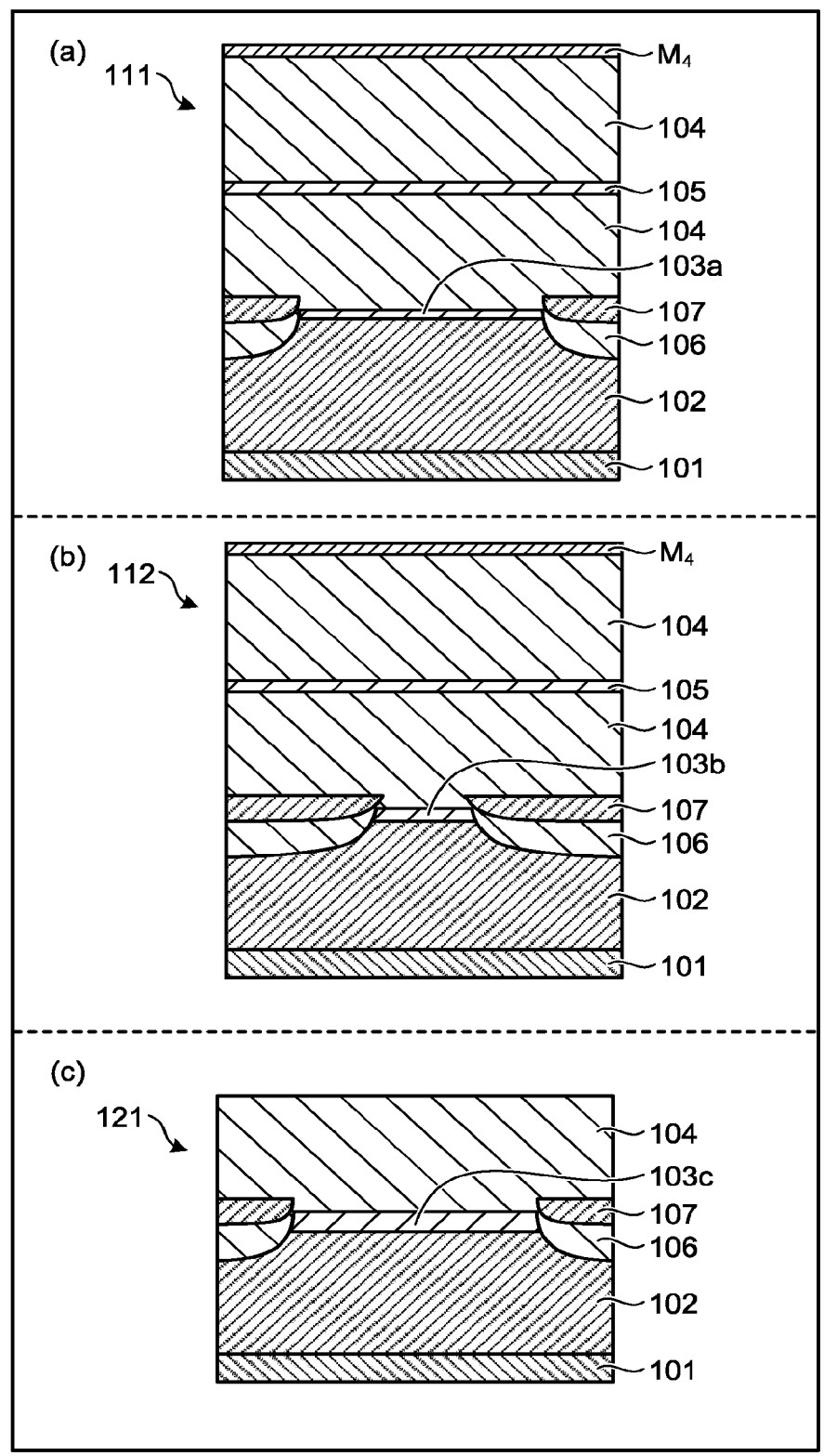
FIG. 10 is a diagram illustrating aspects of manufacturing progress of the semiconductor optical integrated device in a fifth step.

FIG. 10 is a diagram illustrating aspects of manufacturing progress of the semiconductor optical integrated device 100 in a fifth step. In the fifth step, a part of the upper cladding layer 104 in the modulator 121, formed in the ridge waveguide portion 120, is removed by etching.

To be specific, a mask $M_4$ made of a SiNx film is newly deposited on the entire face, patterning is performed so as to cover a region other than the region configured to form the modulator 121, this pattern is used as the mask $M_4$ to remove p-InP as the upper cladding layer 104 up to the etching stop layer 105 by wet etching using a hydrochloric acid-based etchant, and further, to remove p-GaInAsP as the etching stop layer 105 using an etchant containing sulfuric acid and hydrogen peroxide. It is possible to manufacture the thickness of the upper cladding of the ridge waveguide portion 120 with favorable reproducibility by providing the etching stop layer 105.

Figure 11:
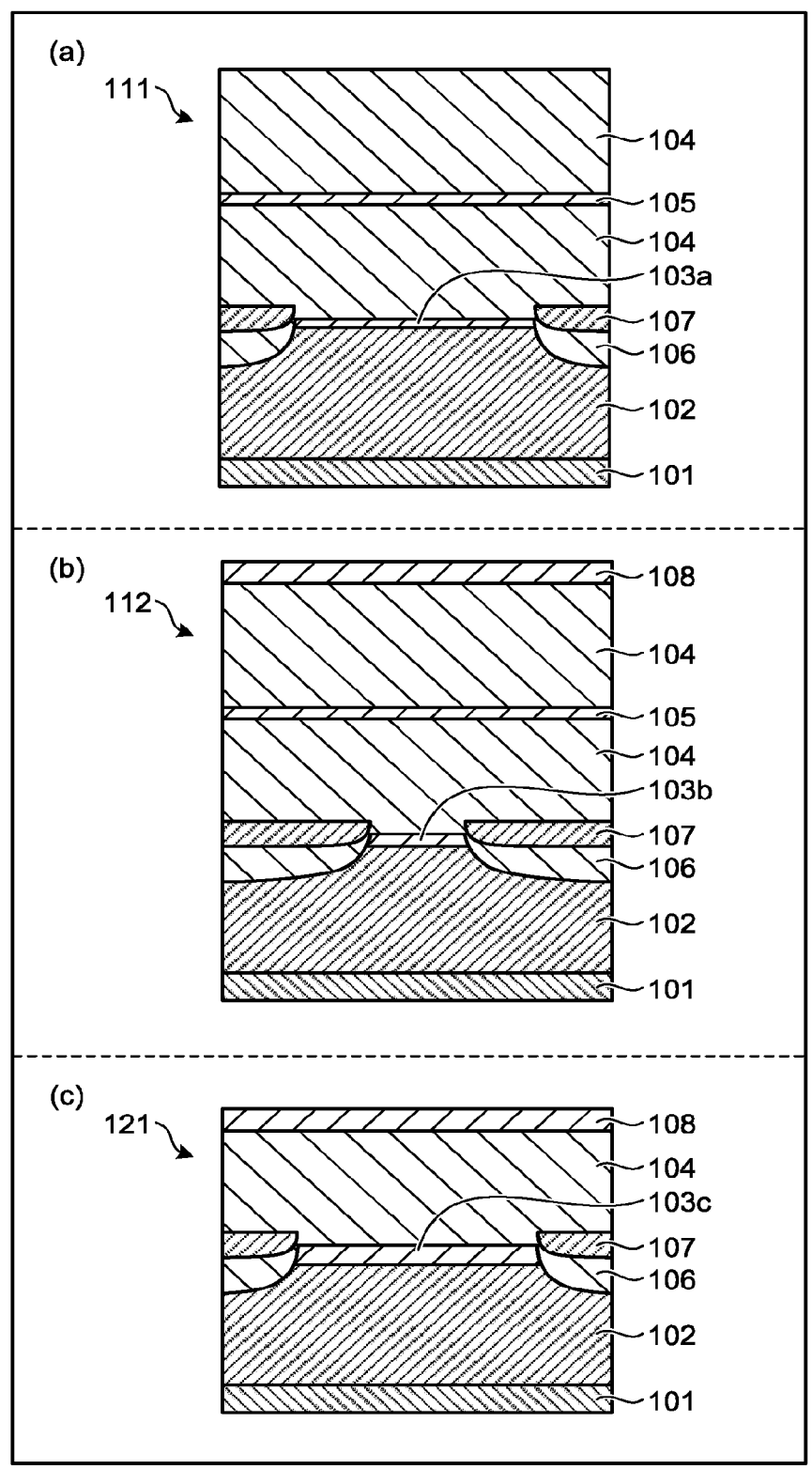
FIG. 11 is a diagram illustrating aspects of the manufacturing progress of the semiconductor optical integrated device in an intermediate step between the fifth step and a sixth step.

FIG. 11 is a diagram illustrating aspects of the manufacturing progress of the semiconductor optical integrated device 100 in an intermediate step between the fifth step and a sixth step. In this intermediate step, the contact layer 108 between the SOA 112 and the modulator 121 is layered. Incidentally, there may be a case where a device which does not require the contact layer 108 is disposed in the ridge waveguide portion 120. In such a case, this step may be omitted, and the contact layer 108 may be layered as a part of the fourth step, for example.

The etching mask $M_4$ used in the fifth step is removed, and then, p-GaInAs as the contact layer 108 is layered on the entire face of the region, configured to form the modulator 121, the SOA 112, and the SSC 111, using a MOCVD method. Thereafter, the contact layer 108 in the region corresponding to the SSC 111 is removed by patterning and etching.

Figure 12:
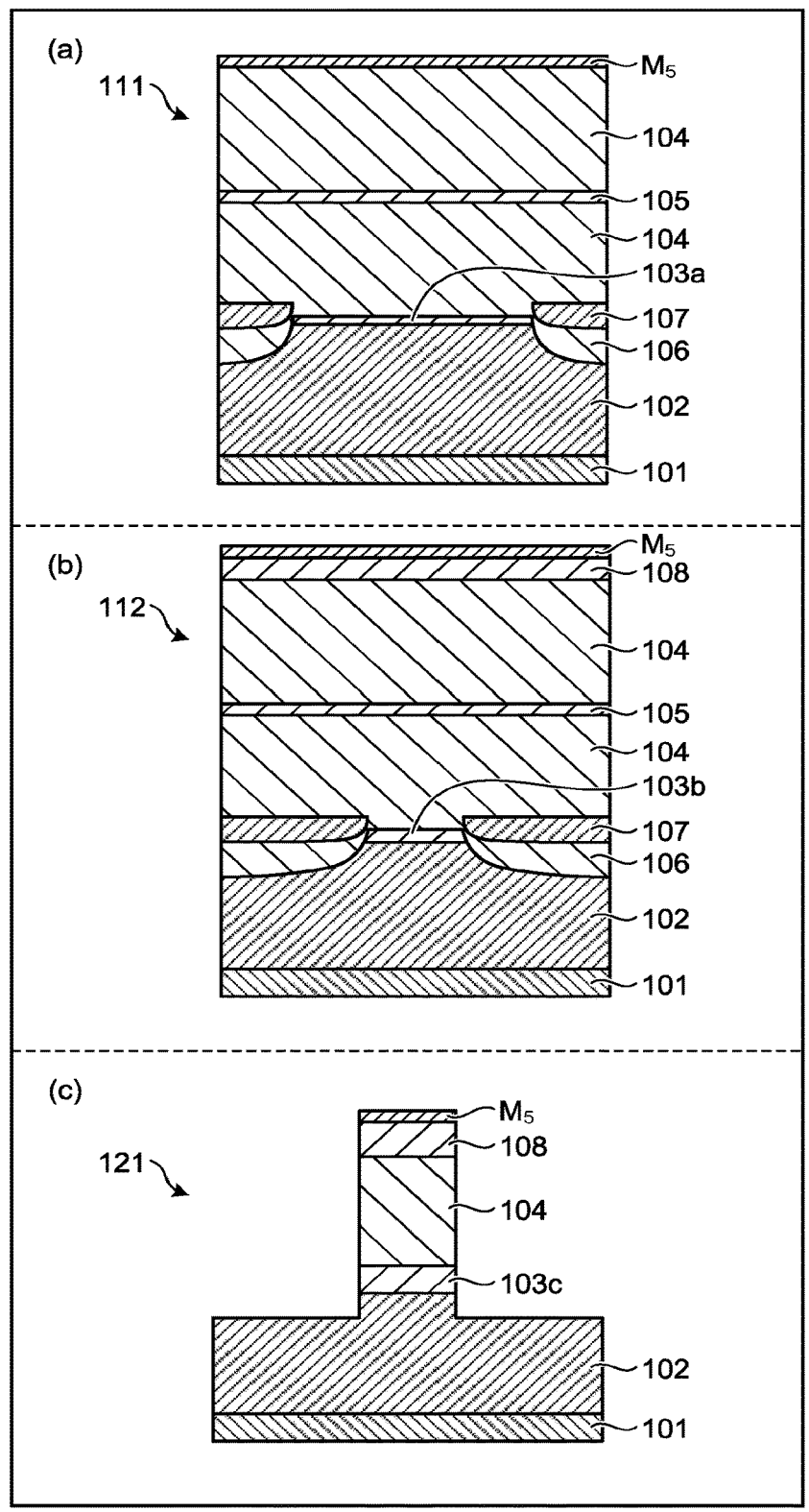
FIG. 12 is a diagram illustrating aspects of manufacturing progress of the semiconductor optical integrated device in the sixth step.

FIG. 12 is a diagram illustrating aspects of manufacturing progress of the semiconductor optical integrated device 100 in the sixth step. In the sixth step, both sides of the waveguide core layer 103c in the region configured to form the modulator 121 are removed, and the contact layer 108, the upper cladding layer 104, the waveguide core layer 103c, a part of the lower cladding layer 102 are etched in a mesa shape.

First, a mask $M_5$ made of a SiNx film is deposited on the entire face of the region, configured to form the modulator 121, the SOA 112, and the SSC 111, and patterning is performed such that openings are formed in regions corresponding to both the sides of the waveguide core layer 103c. At this time, a state is formed where each periphery of the regions corresponding to the SOA 112 and the SSC 111 is covered by SiNx.

Thereafter, this SiNx film is used as the mask $M_5$, and the contact layer 108, the upper cladding layer 104, the waveguide core layer 103c, and a part of the lower cladding layer 102 are etched by dry etching, thereby forming the deep ridge waveguide. At this time, an etching depth is controlled such that an etching depth of the lower cladding layer 102 matches a design value. It is also preferable to use an etching monitor, configured to detect a position of an active layer, in order for the etching depth control. When an etching depth at a position spaced apart from the vicinity of the high mesa is different due to etching properties, the etching is performed such that a depth of a portion near the high mesa matches the design value.

After the above-described step, the mask $M_5$ is removed, the passivation film, the low dielectric permittivity film and the opening portion thereof, the electrodes for current injection and voltage application, and the like are formed in the respective portions, the substrate 101 is polished to have a desired thickness after ending the surface processing, and an electrode is formed at a back face of the substrate 101 if necessary. Here, each device structure of the SSC 111, the SOA 112, and the modulator 121 is completed. Further, the end face is formed using a substrate cleavage, and end face coating and device isolation are performed, and accordingly, the manufacture of the semiconductor optical integrated device 100 is completed.

According to the above-described manufacturing method, the thickness of the upper cladding layer 104 is different between the buried hetero structure waveguide portions 110 and 130, and the ridge waveguide portion 120, and it is possible to set a suitable thickness of the upper cladding layer 104 in each of the SOA 112 and the SSC 111 formed in the buried hetero structure waveguide portions 110 and 130 and the modulator 121 formed in the ridge waveguide portion 120.

Although the method of etching the region of the ridge waveguide portion after layering the upper cladding layer 104 on the entire face has been employed in the above-described manufacturing method, other manufacturing methods may be considered.

In an example of the other manufacturing methods, the process is performed up to the formation of the upper embedded cladding layer 107, and then the upper cladding layer 104 having a thickness of 1.3 µm and the contact layer 108 are formed on the entire face. Thereafter, a SiNx film is deposited on the entire face, and patterning is performed such that openings are formed in the buried hetero structure waveguide portions 110 and 130. The contact layer 108 in the opening portion is removed by etching, and the upper cladding layer 104 having a thickness of 2.2 µm and the contact layer 108 are layered thereon using the MOCVD method. The subsequent step is the same as the above-described manufacturing method. The etching stop layer 105 is unnecessary in this manufacturing method.

In another example of the manufacturing methods, the process is performed up to the formation of the upper embedded cladding layer 107, and then, film thickness control through selective growth is used. To be specific, p-InP is layered such that the upper cladding layer 104 has a thickness of 1.3 µm in the region of the ridge waveguide portion 120 and the upper cladding layer 104 has a thickness of 3.5 µm in the region of the buried hetero structure waveguide portion, and thereafter, p-GaInAs is deposited as the contact layer 108. The subsequent step is the same as the above-described manufacturing method. The etching stop layer 105 is also unnecessary in this manufacturing method.

In still another manufacturing method, it is possible to switch orders of the formation of the mesa structure and the formation of the embedded cladding layer. In this manufacturing method, the respective waveguide core layers are formed, and then, the upper cladding layer 104 having a thickness of 1.3 µm and the contact layer 108 are layered on the entire face. Further, a SiNx film is deposited, and patterning, which corresponds to the modulator 121, the SOA 112, the SSC 111 and the waveguides of the respective connection portions, is performed. Thereafter, etching is performed using this SiNx film as a mask to form a mesa structure, which corresponds to the modulator 121, the SOA 112, the SSC 111, and the waveguides of the respective connection portions, and to expose the lower cladding layer 102.

Next, a selective growth mask made of SiO$_2$ is formed in a portion corresponding to the region of the ridge waveguide portion 120. The mask of the SiNx film used to form the mesa structure and the mask of SiO$_2$ are used as the selective growth masks, and the lower embedded cladding layer 106 and the upper embedded cladding layer 107 are layered using an embedded MOCVD method. Thereafter, all the selective growth masks are once removed, SiNx is deposited, and patterning is performed such that an opening is formed in the buried hetero structure waveguide region. Etching is performed to remove p-GaInAs in the opening portion, and further, the upper embedded cladding layer 107 having a thickness of 2.2 µm and the contact layer 108 are layered in the opening portion using the MOCVD method.

Review of Characteristics

Hereinafter, characteristics of the semiconductor optical integrated device 100 according to this embodiment will be described while illustrating a comparative example when necessary.

The waveguide of the modulator 121 of the semiconductor optical integrated device 100 has the deep ridge waveguide structure. A propagation loss in the waveguide of the modulator 121 was 0.7 dB/mm in a wavelength of 1.55 µm. Meanwhile, a propagation loss was 1.5 dB/mm in a device according to a comparative example, which has a waveguide of high-mesa structure in which a thickness of an upper cladding layer is set to 4.5 µm to be the same as each thickness of the upper cladding layers 104 of the buried hetero structure waveguide portions 110 and 130, which is larger as compared to this embodiment.

In addition, a variation among waveguide characteristics of devices was great in the device according to this comparative example, and there were many individuals that became multi-mode waveguides or had a large loss in the bending waveguide. Further, there were many devices whose high-mesa structures were destroyed during the manufacturing process in the waveguides according to the comparative example.

Such failure in the comparative example having the thick upper cladding layer can be described as follows. An etching depth required for formation of the high-mesa structure is 2.5 µm when the thickness of the upper cladding layer is 1.5 µm in the modulator 121, and 5.5 µm when the thickness of the upper cladding layer is 4.5 µm. In this manner, the etching depth needs to be doubled or more when the upper cladding layer is thick, and thus, recession of an etching mask easily occurs during etching, and as a result, surface roughness of a core-side face increases. Thus, it is considered that the amount of scattering loss in relation to roughness near the mesa increases.

In addition, a variation in etching depth of the lower cladding layer increases when the necessary etching amount is increased. The variation in the entire etching depth increases the variation in etching depth of the lower cladding layer. Further, not only the etching depth but also a layering thickness of the MOCVD has in-wafer-plane distribution, variations are added unless shapes of the two in-plane distributions completely match each other, which greatly affects the etching depth of the lower cladding layer.

For example, when there is an in-wafer-plane distribution of ±5% including the etching depth and crystal growth, a variation is ±125 nm if an etching depth is 2.5 µm, but a variation is ±275 nm if an etching depth is 5.5 µm. In this manner, the etching depth of the lower cladding layer varies, the number of devices of waveguides having values deviating from an optimum value of etching depth of the lower cladding layer increases, and as a result, the single-mode property or the bending waveguide loss tends to vary from a design value. Thus, it is considered that the variation of the waveguide characteristic increases in the comparative example.

In addition, when an aspect ratio (ratio between a vertical size and a horizontal size) of a mesa in the deep ridge waveguide is considered, the ratio is 1.67 when the thickness of the upper cladding layer is 1.5 µm, and is 3.67 when the thickness of the upper cladding layer is 4.5 µm. It is considered that mechanical strength decreases in the mesa having the aspect ratio greatly exceeding 2 like the comparative example because the elongated mesa protrudes on the substrate, and the structure is destroyed even with a little pressure applied during the manufacturing process.

In addition, a series resistance in the portion of the modulator 121 according to this embodiment was 2.2Ω for each length of 1 mm. On the other hand, a series resistance was 3.4Ω in the device according to the comparative example in which the thickness of the upper cladding layer was 4.5 µm. Since the width of the upper cladding layer is small in the deep ridge waveguide, the resistance of p-InP is likely to increase. Thus, it is considered that the series resistance was increased in the comparative example having the thick upper cladding layer since the resistance of p-InP became more remarkable.

When the series resistance is high, the high-frequency response deteriorates due to an increase of a CR constant in the concentrated electrode type electrode structure and an increase of high-frequency loss in a travelling wave electrode type electrode structure. However, the modulator 121 according to this embodiment is preferable for high-speed operation since the thickness of the upper cladding layer is suppressed to be thin, and as a result, the series resistance is low.

Figure 13:
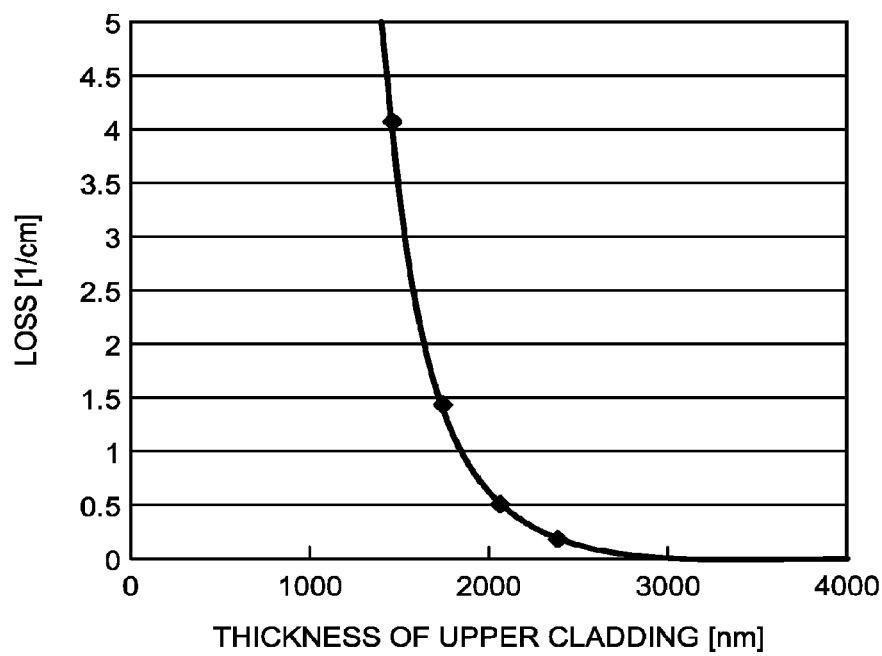
FIG. 13 is a graph illustrating a relationship between a thickness of an upper cladding layer in the SOA and an absorption loss in a contact layer.

FIG. 13 is a graph illustrating a relationship between a thickness of the upper cladding layer 104 in the SOA 112 and an absorption loss in the contact layer 108.

Since the contact layer 108 is made of GaInAs whose refractive index is high, some of light propagated in the waveguide is absorbed by the contact layer 108 when the waveguide core layer 103b and the contact layer 108 are close to each other. It is because light is absorbed by inter valence band absorption as p-carrier density is high in the contact layer 108. Thus, the thicker the upper cladding layer 104 is, the smaller the absorption loss in the contact layer 108 is.

As readable from the graph illustrated in FIG. 13, the absorption loss in the contact layer 108 is decreased by about 3 $cm^{-1}$ and becomes practically 0 when the thickness of the upper cladding layer 104 of the SOA 112 is 4 µm as compared to the case where the thickness of the upper cladding layer 104 of the SOA 112 is 1.5 µm to be the same thickness as the modulator 121.

A reason that it is difficult to set the thickness of the upper cladding layer 104 of the SOA 112 to be the same thickness as the modulator 121 is because designs of the waveguide core layers thereof greatly differ from each other. As described above, the waveguide core layer 103c of the portion of the modulator 121 is thicker than the waveguide core layer 103b of the portion of the SOA 112. As a result, optical confinement in the waveguide core layer 103c is strong in the modulator 121 so that the leak of light to the upper cladding layer 104 decreases, and the optical absorption in the contact layer 108 hardly occurs even if the upper cladding layer 104 is thin.

Figure 14:
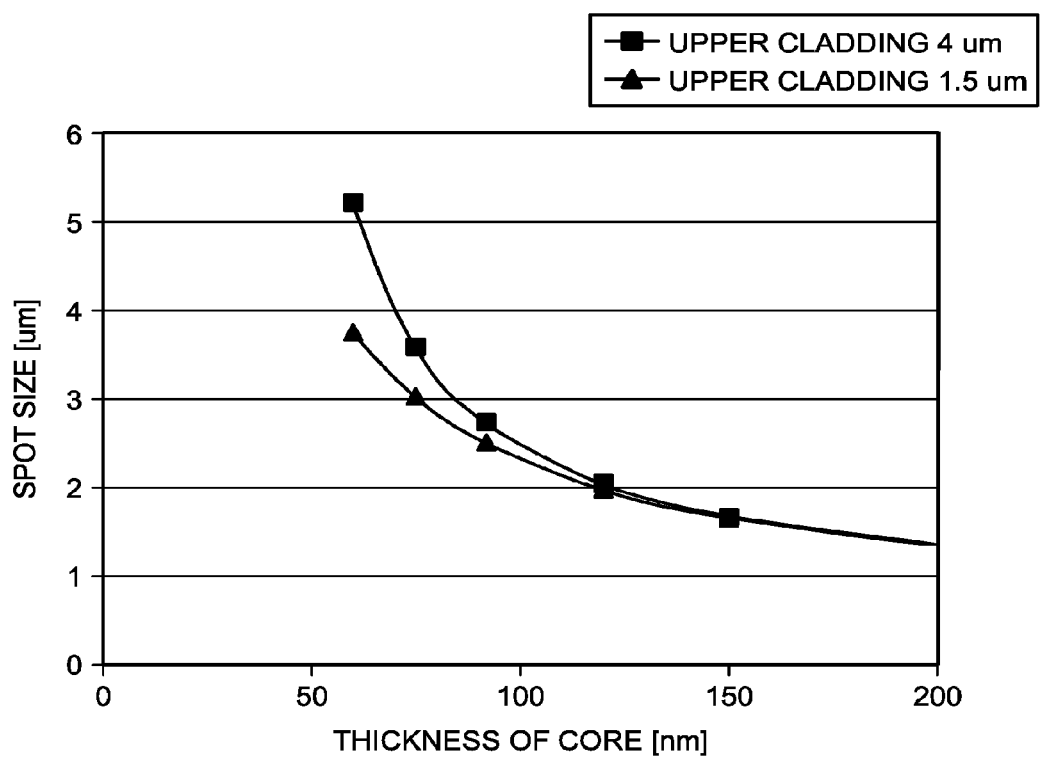
FIG. 14 is a graph illustrating a relationship between a thickness of a waveguide core layer in the SSC and a spot size.

FIG. 14 is a graph illustrating a relationship between a thickness of the waveguide core layer 103a in the SSC 111 and a spot size. FIG. 14 illustrates results obtained by calculating the spot size using two kinds of thickness of the upper cladding layer. Incidentally, the SSC 111 employs a method of weakening the optical confinement in the waveguide core layer 103a by gradually decreasing the thickness of the waveguide core layer 103a and expanding the spot size.

As readable from the graph illustrated in FIG. 14, it is understood that a spot size expansion effect increases as the core thickness decreases when the thickness of the upper cladding layer 104 of the SOA 112 is 4 µm as compared to the case where the thickness of the upper cladding layer 104 of the SSC 111 is 1.5 µm to be the same thickness as the modulator 121.

When the upper cladding layer 104 is thin, the passivation film 141, which is provided on the upper cladding layer 104 and made of SiN, and air act as a second cladding layer which has a significantly large refractive index difference with respect to the semiconductor. Thus, when the thickness of the upper cladding layer 104 is 1.5 µm, it is difficult to expand the spot size beyond the top face of the upper cladding layer 104. Meanwhile, there is no limit described above when the upper cladding layer 104 is sufficiently thick, and thus, it is possible to obtain a remarkable spot size expansion effect.

In addition, when the upper cladding layer 104 is 1.5 µm, the spot is limited by the top face of the upper cladding layer 104 on the upper side the waveguide core layer 103a, but the spot is spread on the lower side of the waveguide because there is no limit described above, and accordingly, asymmetry of spot shapes in the up-and-down direction significantly increases. As a result, a shape of a beam to be emitted from the SSC 111 deviates from a Gaussian beam.

As compared to the case where the thickness of the waveguide core layer 103a is 75 nm, a Gaussian beam coupling rate, which is the maximum coupling efficiency between an output beam and the Gaussian beam, is 94.6% when the thickness of the upper cladding layer 104 is 4 µm, but the Gaussian beam coupling rate becomes 89.9% when the thickness of the upper cladding layer 104 is 1.5 µm.

When the Gaussian beam coupling rate decreases in this manner, a single-mode optical fiber has a mode profile close to the Gaussian beam, thereby decreasing the coupling efficiency to the optical fiber. Therefore, the coupling efficiency to the optical fiber is sacrificed even if the spot size is expanded by further decreasing the thickness of the waveguide core layer 103a when the thickness of the upper cladding layer is 1.5 µm without any change.

As the thickness of the upper cladding layer 104 of the SSC 111 is set to be greater than the thickness of the upper cladding layer 104 of the modulator 121 in the semiconductor optical integrated device 100 according to this embodiment, the spot size is large, the assembly of the module is easy, and further, it is possible to obtain a favorable characteristic that the coupling efficiency to the optical fiber is high.

As described above, it is possible to perform the design which is optimal for both the ridge waveguide portion 120 and the buried hetero structure waveguide portions 110 and 130 since the thickness of the upper cladding layer 104 of the buried hetero structure waveguide portions 110 and 130 is set to be greater than the thickness of the upper cladding layer 104 of the ridge waveguide portion 120 in the semiconductor optical integrated device 100 according to this embodiment.

To be specific, it is possible to realize the low waveguide loss, the favorable single-mode property, and the favorable high-frequency response in the modulator 121 by forming the modulator 121 using the deep ridge waveguide, and at the same time, it is possible to realize the beam having the low absorption loss in the SOA 112 and the large spot size and the high fiber coupling efficiency in the SSC 111 by forming the SOA 112 and the SSC 111 using the buried hetero structure waveguides.

Incidentally, the difference in thickness between the upper cladding layer 104 of the ridge waveguide portion 120 and the upper cladding layer 104 of the buried hetero structure waveguide portion 110 or 130 is set to 3 µm in the semiconductor optical integrated device 100 according to this embodiment. This difference value can be appropriately designed, and it is possible to select a value which is equal to or larger than a degree of attenuation with respect to an evanescent wave distance in the cladding layer. For example, it is possible to expect the above-described effects as long as the difference of the thickness of the upper cladding layer 104 between the ridge waveguide portion 120 and the buried hetero structure waveguide portion 110 or 130 is 200 nm or larger.

Although the deep ridge waveguide is used as the waveguide to be integrated with the buried hetero structure waveguide structure in the semiconductor optical integrated device 100 according to this embodiment, it is possible to obtain the same effects of this embodiment even when a so-called shallow ridge structure where a core layer is not etched is used since there is the common problem to the deep ridge structure in relation to the mechanical strength and the electric resistance.

Although the single Mach-Zehnder modulator is provided as the modulator in this embodiment, an I-Q modulator formed of a plurality of Mach-Zehnder modulators may be provided, or two I-Q modulators may be provided for polarization multiplexing. In addition, the SOA 112 and the modulator 121 have been disposed in parallel, but may be disposed such that each light propagation direction becomes perpendicular to each other.

Second Embodiment

Planar Structure

Figure 15:
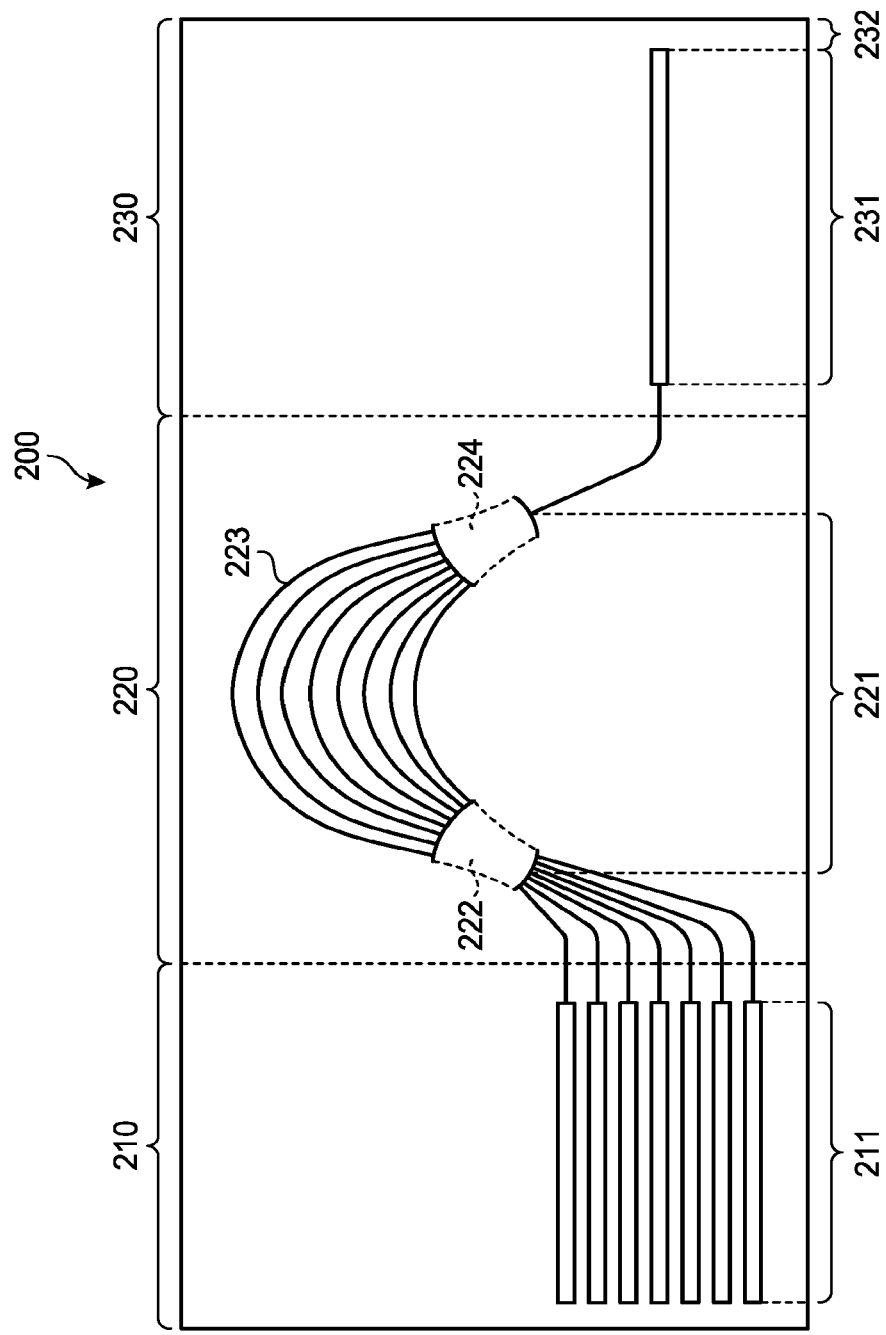
FIG. 15 is a schematic top view of a semiconductor optical integrated device according to a second embodiment.

FIG. 15 is a schematic top view of the semiconductor optical integrated device according to the second embodiment. Incidentally, the schematic top view illustrated in FIG. 15 illustrates only a waveguide and does not illustrate other components such as an electrode for simplification.

As illustrated in FIG. 15, a semiconductor optical integrated device 200 according to the second embodiment is provided with a buried hetero structure waveguide portion 210, a ridge waveguide portion 220, and a buried hetero structure waveguide portion 230. The buried hetero structure waveguide portions 210 and 230 are regions each of which has a waveguide structure in which semiconductor cladding materials are embedded near both sides of a waveguide core layer, and the ridge waveguide portion 220 is a region which has a waveguide structure in which a semiconductor layer including at least a waveguide core layer and an upper cladding layer protrudes in a mesa shape. Incidentally, the waveguide of the ridge waveguide portion 220 according to this embodiment has a deep ridge waveguide in which a part up to the semiconductor layer including at least the waveguide core layer protrudes in the mesa shape.

The buried hetero structure waveguide portion 210 is provided with DFB lasers 211. The plurality of DFB lasers 211 have different oscillation wavelengths in a wavelength band of, for example, 1.55 μm, and further, the oscillation wavelength of the DFB laser 211 is changed by changing temperature of the DFB laser 211. Therefore, the plurality of DFB lasers 211 perform rough adjustment by selecting one of the plurality of DFB lasers 211, perform fine adjustment according to a temperature change, and operate as a wavelength-tunable light source that performs oscillation in a continuous wavelength range as a whole. The guided light emitted from the plurality of DFB lasers 211 is guided to the ridge waveguide portion 220.

The ridge waveguide portion 220 is provided with an AWG 221. As illustrated in FIG. 15, the AWG 221 is provided with an input-side slab waveguide 222, an array channel waveguide 223, and an output-side slab waveguide 224. The input-side slab waveguide 222 and the output-side slab waveguide 224 are waveguides having no optical confinement force in the lateral direction, and guided light incident to the input-side slab waveguide 222 and emitted from the output-side slab waveguide 224 diverges in the lateral direction. The array channel waveguide 223 is configured using multiple waveguides formed by bending paths, and includes an optical path length difference that depends on a wavelength. Therefore, when the guided light having different oscillation wavelengths, emitted from the plurality of DFB lasers 211, is input to a position of the input-side slab waveguide 222 corresponding to the optical path length difference that depends on the wavelength, the light is coupled to the same light beam in the output-side slab waveguide 224. The guided light coupled in the AWG 221 is output to the buried hetero structure waveguide portion 230 which is provided with an SOA 231.

Here, if it is assumed that a coupler provided between the plurality of DFB lasers 211 and the SOA 231 has no wavelength selectivity, the coupling efficiency between the DFB laser 211 and the SOA 231 becomes 1/n (n is the number of the DFB lasers) or less. For example, when the number of the DFB lasers 211 is 8, the coupling efficiency between each of the DFB lasers 211 and the SOA 231 becomes ⅛ (12.5%) or less. The AWG 221, which transmits through different wavelengths of the DFB lasers 211 at high efficiency, is used as the coupler to connect the plurality of DFB lasers 211 and the SOA 231 in the semiconductor optical integrated device 200, and thus, the coupling efficiency from the DFB laser 211 to the SOA 231 is set to be high.

The buried hetero structure waveguide portion 230 is provided with the SOA 231 and an end-face window structure portion 232. The SOA 231 amplifies the guided light imaged by the AWG 221, and the end-face window structure portion 232 reduces reflectivity in a device end face of the guided light amplified by the SOA 231. The end-face window structure portion 232 is formed by removing a waveguide core layer near the end face. The end face portion is subjected to low reflection coating in order to reduce the reflectivity, and the reflectivity can be further reduced by providing the end-face window structure portion 232.

In the semiconductor optical integrated device 200 according to this embodiment, it is possible to enjoy the advantage that the surface recombination speed near the waveguide is low by forming the DFB lasers 211 and the SOA 231 in the buried hetero structure waveguide structure. In addition, it is possible to obtain a small radius of curvature and a dense waveguide interval as the AWG 221 has the deep ridge waveguide structure, and to obtain the remarkable miniaturization.

Similarly to the first embodiment, waveguides are also present at boundaries between each of the buried hetero structure waveguide portions 210 and 230 and the ridge waveguide portion 220 so as to connect the buried hetero structure waveguide portion and the ridge waveguide portion in this embodiment. Similarly to the first embodiment, it is possible to reduce a loss at a connection portion regarding the waveguide by forming the ridge waveguide portion 220 to have a wider waveguide than the buried hetero structure waveguide portions 210 and 230 or by providing a flare structure.

Cross-Sectional Structure

FIGS. 16 to 19 are cross-sectional schematic views of the DFB laser 211, the AWG 221, the SOA 231, and the end-face window structure portion 232, respectively, on a face perpendicular to the waveguide.

Cross-Sectional Structure: DFB Laser

Figure 16:
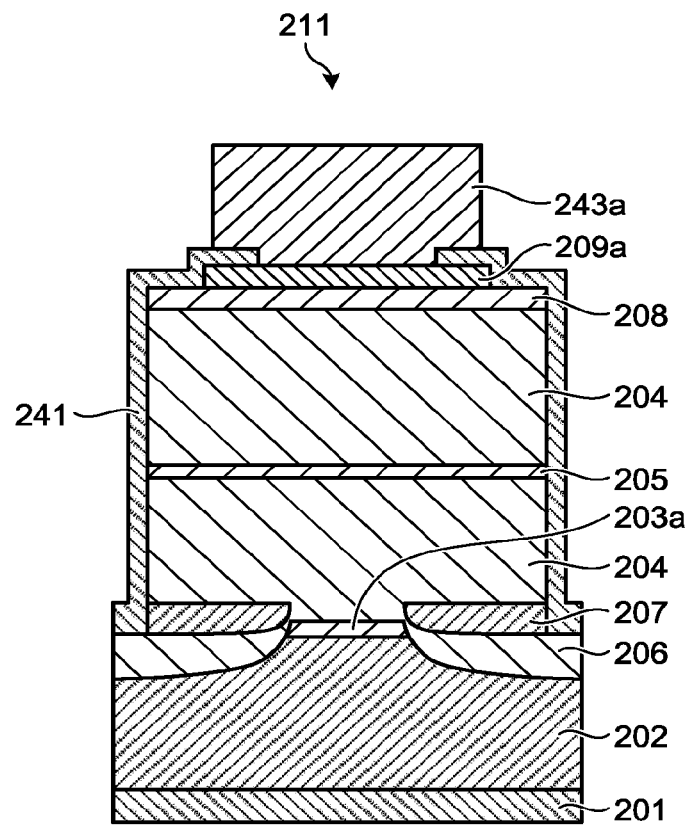
FIG. 16 is a cross-sectional schematic view of a DFB laser on the face perpendicular to the waveguide.

As illustrated in FIG. 16, the DFB laser 211 has a structure in which a lower cladding layer 202, a waveguide core layer 203a, and an upper cladding layer 204 are sequentially layered on a substrate 201. A material of the substrate 201 is InP, and a material of the lower cladding layer 202 is n-InP. Incidentally, the material of the substrate 201 may be n-InP. In addition, when a high-frequency characteristic is focused, an n-side electrode may be provided in the lower cladding layer 202 and the material of the substrate 201 may be semi-insulating InP.

The waveguide core layer 203a is configured as an active layer of a multi quantum well structure which is made of a material of GaInAsP that emits light by current injection. In addition, a diffraction grating layer (not illustrated) is provided on a top face of the waveguide core layer 203a. A thickness of the waveguide core layer 203a including an SCH layer is 150 nm, and a width thereof is 1.7 μm.

A material of the upper cladding layer 204 is p-InP, and an etching stop layer 205, which has different etching resistance from the upper cladding layer 204, is inserted inside the upper cladding layer 204. Similarly to the first embodiment, it is also possible to omit the etching stop layer 205 depending on a manufacturing method. The thickness of the upper cladding layer 204 including the etching stop layer 205 is 4.5 µm. Incidentally, when the etching stop layer 205 is inserted, a thickness of the etching stop layer 205 is, for example, 10 nm.

The waveguide core layer 203a of the DFB laser 211 has a structure in which a lower embedded cladding layer 206 and an upper embedded cladding layer 207 are embedded near both sides of the waveguide core layer 203a. Materials of the lower embedded cladding layer 206 and the upper embedded cladding layer 207 are p-InP and n-InP, respectively. The lower embedded cladding layer 206 and the upper embedded cladding layer 207 serve as current blocking layers, and enhance the injection efficiency of current to be injected into the waveguide core layer 203a.

A contact layer 208 made of p-GaInAs is provided on the upper cladding layer 204 and is in contact with a p-side electrode 209a. In addition, a passivation film 241 made of SiNx is suitably formed on a top face and a side face of the DFB laser 211, and each of the neighboring DFB lasers 211 is electrically isolated from each other. Further, the p-side electrode 209a is in contact with a wiring 243a such as a bonding wire.

Cross-Sectional Structure: AWG

Figure 17:
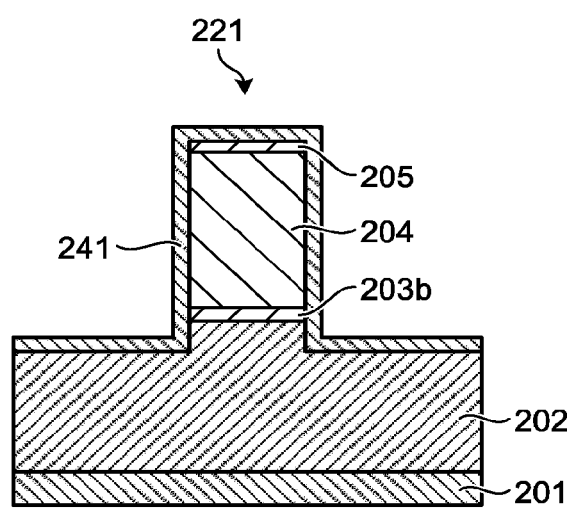
FIG. 17 is a cross-sectional schematic view of an AWG on the face perpendicular to the waveguide.

As illustrated in FIG. 17, the AWG 221 has a structure in which the lower cladding layer 202, the waveguide core layer 103b, and the upper cladding layer 204 are sequentially layered on the substrate 201. Incidentally, the respective materials of the substrate 201, the lower cladding layer 202, and the upper cladding layer 204 are the same as those of the DFB laser 211.

The waveguide core layer 203b is configured in a bulk structure whose material is GaInAsP. A thickness of the waveguide core layer 203b is 200 nm, and a width thereof is 1.7 µm.

A thickness of the upper cladding layer 204 is 2.3 µm. In this embodiment, the thickness of the upper cladding layer 204 in the ridge waveguide portion 220 is greater than that of the first embodiment. This is because light distribution of a waveguide mode easily spreads in this embodiment since the waveguide core layer 203b is thinner than that of the first embodiment.

The etching stop layer 205 is provided on the upper cladding layer 204, but the etching stop layer 205 may be removed. In addition, the passivation film 241 made of SiNx is suitably formed on a top face of the AWG 221.

Cross-Sectional Structure: SOA

Figure 18:
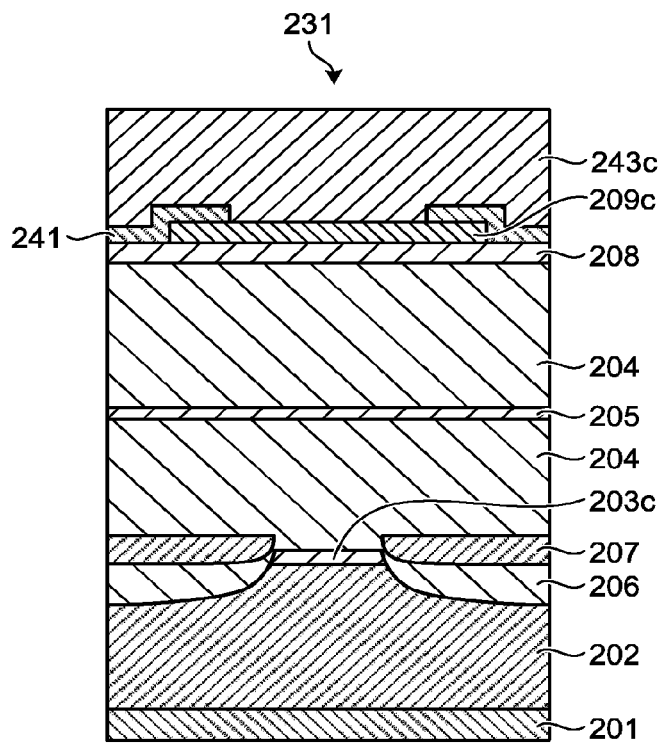
FIG. 18 is a cross-sectional schematic view of the SOA on the face perpendicular to the waveguide.

As illustrated in FIG. 18, the SOA 231 has a structure in which the lower cladding layer 202, a waveguide core layer 203c, and the upper cladding layer 204 are sequentially layered on the substrate 201. Incidentally, the respective materials of the substrate 201, the lower cladding layer 202, and the upper cladding layer 204 are the same as those of the DFB laser 211.

The waveguide core layer 203c is configured in the multi quantum well structure which is made of a material of GaInAsP that emits light by current injection. A thickness of the waveguide core layer 203b including an SCH layer is 150 nm, and a width thereof is 1.7 µm.

The etching stop layer 205 having different etching resistance from the upper cladding layer 204 is inserted inside the upper cladding layer 204. Similarly to the first embodiment, it is also possible to omit the etching stop layer 205 depending on a manufacturing method. The thickness of the upper cladding layer 204 including the etching stop layer 205 is 4.5 µm. Incidentally, when the etching stop layer 205 is inserted, a thickness of the etching stop layer 205 is, for example, 10 nm.

The waveguide core layer 203c of the SOA 231 has a waveguide structure in which the lower embedded cladding layer 206 and the upper embedded cladding layer 207 are embedded near both sides of the waveguide core layer 203a. Materials of the lower embedded cladding layer 206 and the upper embedded cladding layer 207 are p-InP and n-InP, respectively. The lower embedded cladding layer 206 and the upper embedded cladding layer 207 serve as current blocking layers, and enhance the injection efficiency of current to be injected into the waveguide core layer 203c.

The contact layer 208 made of p-GaInAs is provided on the upper cladding layer 204 and is in contact with a p-side electrode 209c. In addition, the passivation film 241 made of SiNx is suitably formed on a top face of the SOA 231. Further, the p-side electrode 209c is in contact with a wiring 243c such as a bonding wire.

Cross-Sectional Structure: End-Face Window Structure Portion

Figure 19:
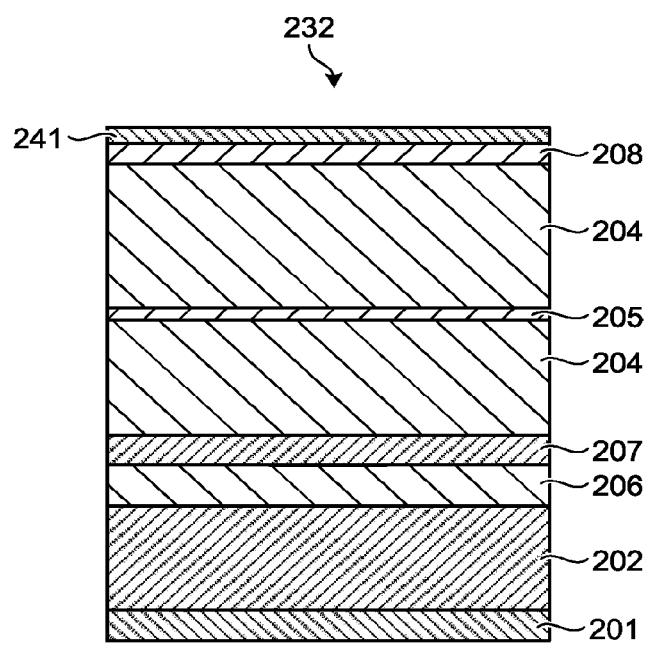
FIG. 19 is a cross-sectional schematic view of an end-face window structure portion on the face perpendicular to the waveguide.

As illustrated in FIG. 19, the end-face window structure portion 232 has a structure in which the lower cladding layer 202, the lower embedded cladding layer 206, the upper embedded cladding layer 207, and the upper cladding layer 204 are sequentially layered on the substrate 201. Incidentally, the respective materials of the substrate 201, the lower cladding layer 202, the lower embedded cladding layer 206, the upper embedded cladding layer 207, and the upper cladding layer 204 are the same as those of the DFB laser 211.

As apparent from FIG. 19, there is no waveguide core layer in the end-face window structure portion 232, and instead of it, a portion between the lower cladding layer 202 and the upper cladding layer 204 is filled with the lower embedded cladding layer 206 and the upper embedded cladding layer 207.

As described with reference FIGS. 16 to 19 above, the thickness of the upper cladding layer 204 of the buried hetero structure waveguide portion 210 or 230 is greater than the thickness of the upper cladding layer 204 of the ridge waveguide portion 220 in the semiconductor optical integrated device 200 according to the second embodiment. This is because the design focusing on the respective device characteristics has been performed.

Manufacturing Method

Next, a method of manufacturing the semiconductor optical integrated device 200 according to this embodiment will be described. Incidentally, the method of manufacturing the semiconductor optical integrated device 200 according to this embodiment is similar to the method of manufacturing the semiconductor optical integrated device 100 according to the first embodiment, and thus, the description thereof will be appropriately omitted.

First, the lower cladding layer 202, the waveguide core layers 203a and 203c of the DFB laser 211 and the SOA 231, a part of the upper cladding layer 204, and the diffraction grating layer are sequentially layered on the substrate 201 using an MOCVD method. Each of the waveguide core layers 203a and 203c has the multi quantum well structure made of GaInAsP, and the diffraction grating layer is made of GaInAs.

Next, a SiNx film is deposited on the entire face, the SiNx film is subjected to patterning in accordance with a pattern of a periodic diffraction grating of the diffraction grating layer to be formed in the DFB laser 211 portion, and SiNx near the SOA 231 portion is removed. Further, etching is performed using the SiNx film as a mask. Accordingly, a diffraction grating structure is formed in the diffraction grating layer. Thereafter, the SiNx film on the entire face is removed, and then, the upper cladding layer 204 is layered by growth over grating using a MOCVD method.

A SiNx film is deposited on the entire face again, and the portions corresponding to the DFB laser 211 and the SOA 231 are subjected to patterning so as to obtain a pattern with a slightly wide width. Further, etching is performed using this SiNx film as a mask, and the waveguide core layer in a region configured to form the AWG is removed, thereby exposing the lower cladding layer 202. Subsequently, the mask of the SiNx film is directly used as a selective growth mask, and the waveguide of the AWG 221 core layer 203*b* and the upper cladding layer 204 are layered using a MOCVD method.

Next, the mask of the SiNx film is removed, and then, a SiNx film is newly deposited, and patterning is performed so as to obtain a pattern corresponding to the DFB laser 211, the SOA 231, and the waveguides of the respective connection portions. At this time, the AWG 221, configured to form the deep ridge waveguide in the subsequent step, and the waveguide at the connection portion in the vicinity thereof are subjected to patterning so as to have a wider width than the width of the waveguide core layer. In addition, the pattern is removed from a portion configured to form the end face the window structure.

Further, etching is performed using this SiNx film as a mask to form a mesa structure, which corresponds to the DFB lasers 211, the SOA 231, and the waveguides of the respective connection portions, and to expose the lower cladding layer 202. Next, the mask of the SiNx film is used as a selective growth mask, and the lower embedded cladding layer 206 and the upper embedded cladding layer are layered on the exposed lower cladding layer 202 using the MOCVD method.

Next, the mask of the SiNx film is removed, and then, the upper cladding layer 204, the etching stop layer 205 having a thickness of 10 nm, the upper cladding layer 204, and the contact layer 208 are sequentially layered on the entire face using the MOCVD method.

Thereafter, patterning is performed to cover a region other than the region configured to form the deep ridge waveguide, the contact layer 208 made of p-GaInAs is removed using an etchant containing sulfuric acid and hydrogen peroxide using the pattern as a mask, and further, the upper cladding layer 204 up to the etching stop layer 205 is removed by wet etching using a hydrochloric acid-based etchant.

Next, a SiNx film is deposited on the entire face, and patterning is performed such that openings are formed in portions which correspond to both sides of the deep ridge waveguide. At this time, each periphery of regions of the SOA 231 and the DFB laser 211 is in the state of being covered by SiNx, and the openings are formed in trench regions on the right and left of the DFB laser 211.

Further, this SiNx is used as a mask, and the etching stop layer 205, the upper cladding layer 204, the waveguide core layer, and a part of the lower cladding layer 202 are etched by dry etching, thereby forming the mesa structure.

Here, the etching is performed such that an etching depth of the lower cladding layer 202 near the deep ridge structure matches a design value. At this time, etching is performed in the trench that electrically isolates the DFB laser 211 at least until reaching the etching stop layer 205 from the contact layer 208, the upper cladding layer 204. Further, a portion other than the trench is covered, and hydrochloric acid-based wet etching is performed to increase an etching depth of this trench.

Thereafter, the passivation film 241, the opening portion thereof, the p-side electrodes 209*a* and 209*c* for current injection, and the like are formed in the respective portions using a known method. The substrate 201 is polished to have a desired thickness after ending the surface processing, and an electrode is formed at a back face thereof.

Further, the end face is formed using a substrate cleavage, and end face coating and device isolation are performed, and accordingly, the manufacturing the semiconductor optical integrated device 200 is completed.

Similarly to the first embodiment, it is also possible to use the above-described modifications of the manufacturing method in the method of manufacturing the semiconductor optical integrated device 200 according to this embodiment.

Review of Characteristics

Hereinafter, characteristics of the semiconductor optical integrated device 200 according to this embodiment will be described while illustrating a comparative example when necessary.

Similarly to the first embodiment, it was also possible to obtain favorable properties that the waveguide of the AWG 221 having the deep ridge waveguide structure is hardly destroyed with a small loss and a small characteristic variation in the semiconductor optical integrated device 200 according to this embodiment.

In addition, a unimodal emitted light beam was obtained in the semiconductor optical integrated device 200 according to this embodiment while there was a problem that a shape of an emitted light beam is remarkably disturbed in a comparative example in which a thickness of an upper cladding layer in the entire region was set to 2.3 μm. A reason thereof is considered to be based on a phenomenon that a beam spreading in the window structure is reflected at an upper semiconductor terminating end when the thickness of the upper cladding layer is thin.

Figure 20:
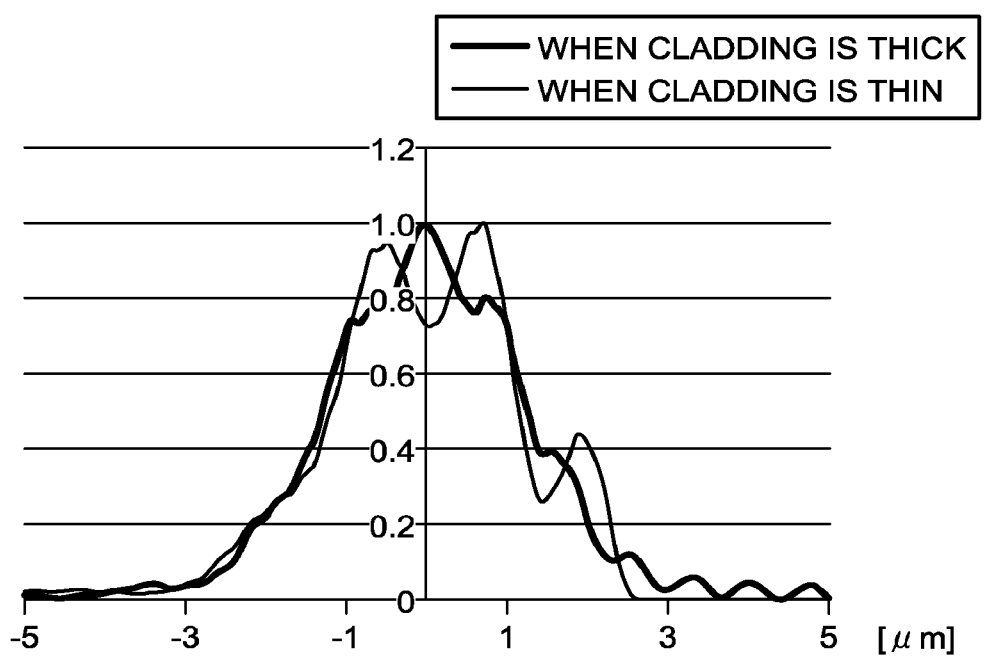
FIG. 20 is a graph illustrating a result obtained by calculating an optical intensity distribution at an end face using a BPM.

FIG. 20 is a graph illustrating a result obtained by calculating an optical intensity distribution at the end face using a beam propagation method (BPM), the horizontal axis represents a position (unit: μm) in the vertical direction (thickness direction) and the vertical axis thereof represents a relative optical intensity obtained through standardization by setting a maximum value as 1. In the comparative example having the thin upper cladding layer, the reflection at the top face is great, and there are a plurality of split peaks in a beam shape. On the other hand, the influence of reflection at the top face is little, and the unimodal property of the beam shape is maintained even if there is somewhat reflection when the upper cladding layer has a sufficient thickness as in the semiconductor optical integrated device 200 according to this embodiment.

When the window structure portion is provided in this manner, it is necessary to determine the thickness of the upper cladding layer on consideration of a width of the beam after spreading in the window structure portion. It is preferable to provide the upper cladding layer having a thickness twice or more for a $1/e^2$ width of the spread beam.

In addition, it is preferable to set the thickness of the upper cladding layer 104 of the DFB lasers 211 and the thickness of the upper cladding layer 104 of the SOA 231 to be the same in order to facilitate the manufacture. In addition, it is possible to expect the above-described effects as long as the difference of the thickness of the upper cladding layer 104 between the ridge waveguide portion 220 and the buried hetero structure waveguide portion 210 or 230 is 200 nm or larger.

As described above, the thickness of the upper cladding layer in the buried hetero structure waveguide portion is set to be larger than the thickness of the upper cladding layer in the ridge waveguide portion in the semiconductor optical integrated device 200 according to this embodiment, and thus, it is possible to perform optimal designs for both the ridge waveguide portion and the buried hetero structure waveguide portion.

To be specific, it is possible to realize the small waveguide loss and the favorable single-mode property in the AWG 221 by forming the AWG 221 using the deep ridge waveguide, and at the same time, it is possible to realize the unimodal beam having a high fiber coupling efficiency while having a low reflective end face by forming the DFB laser 211 and the SOA 231 using the buried hetero structure waveguides in the semiconductor optical integrated device 200 according to this embodiment.

A semiconductor optical integrated device and a method of manufacturing the same according to the disclosure have an effect that it is possible to resolve the trade-off relationship of performance between the buried hetero structure waveguide and the deep ridge waveguide.

Although the disclosure has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A semiconductor optical integrated device comprising:
    a substrate;
    at least a lower cladding layer, a waveguide core layer, and an upper cladding layer sequentially layered on the substrate;
    a buried hetero structure waveguide portion having a waveguide structure in which a semiconductor cladding material is embedded near each of both sides of the waveguide core layer; and
    a ridge waveguide portion having a waveguide structure in which a semiconductor layer including at least the upper cladding layer protrudes in a mesa shape,
    wherein a thickness of the upper cladding layer in the buried hetero structure waveguide portion is greater than a thickness of the upper cladding layer in the ridge waveguide portion, and
    wherein an intermediate layer, which has different etching resistance from that of the upper cladding layer and has slower etching speed than that of the upper cladding layer, is inserted in the upper cladding layer in the buried hetero structure waveguide portion.

2. The semiconductor optical integrated device according to claim 1, wherein
    the ridge waveguide portion has a deep ridge waveguide structure in which a semiconductor layer including the waveguide core layer protrudes in the mesa shape.

3. The semiconductor optical integrated device according to claim 1, further comprising
    an end-face window structure portion having a window structure in which a region adjacent to the buried hetero structure waveguide portion is filled with a semiconductor cladding material instead of the waveguide core layer.

4. The semiconductor optical integrated device according to claim 1, wherein
    the buried hetero structure waveguide portion is a spot size converter which gradually converts a spot size of light propagated in a waveguide.

5. The semiconductor optical integrated device according to claim 1, wherein
    the waveguide core layer of the buried hetero structure waveguide portion is thinner than the waveguide core layer of the ridge waveguide portion.

6. The semiconductor optical integrated device according to claim 1, wherein
    the intermediate layer is an etching stop layer.

7. The semiconductor optical integrated device according to claim 1, wherein
    the buried hetero structure waveguide portion includes at least an optical amplifier, and
    the ridge waveguide portion includes at least a modulator.

8. The semiconductor optical integrated device according to claim 1, wherein
    the buried hetero structure waveguide portion includes at least a plurality of laser oscillators, and
    the ridge waveguide portion includes at least an arrayed waveguide grating.

9. A method of manufacturing a semiconductor optical integrated device which includes a buried hetero structure waveguide portion and a ridge waveguide portion, the method comprising:
    a first step of layering at least a lower cladding layer and a waveguide core layer on a substrate in a region where the buried hetero structure waveguide portion is to be formed and a region where the ridge waveguide portion is to be formed;
    a second step of etching a semiconductor layer which includes the waveguide core layer in a mesa shape in the region where the buried hetero structure waveguide portion is to be formed;
    a third step of embedding a semiconductor cladding material near both sides of the waveguide core layer in the region where the buried hetero structure waveguide portion is to be formed;
    a fourth step of layering a semiconductor layer, which includes at least an upper cladding layer, in the region where the buried hetero structure waveguide portion is to be formed and the region where the ridge waveguide portion is to be formed;
    a fifth step of performing etching to remove a part of the upper cladding layer in the region where the ridge waveguide portion is to be formed; and
    a sixth step of removing both sides of the waveguide core layer in the regions where the ridge waveguide portion is to be formed and etching the semiconductor layer which includes at least the upper cladding layer in a mesa shape, in this order.

10. The method of manufacturing the semiconductor optical integrated device according to claim 9, wherein
    the fourth step includes a step of inserting an etching stop layer which has different etching resistance from that of the upper cladding layer to stop the etching in the fifth step.

11. The method of manufacturing the semiconductor optical integrated device according to claim 9, further comprising
    a step of layering a contact layer on the upper cladding layer between the fifth step and the sixth step.

12. The method of manufacturing the semiconductor optical integrated device according to claim 9, wherein the fifth step includes performing etching to remove the part of the upper cladding layer in the region where the ridge waveguide portion is to be formed so that a thickness of the upper cladding layer in the buried hetero structure waveguide portion is greater than a thickness of the upper cladding layer in the ridge waveguide portion.

* * * * *